US009852859B2

(12) United States Patent
Cao et al.

(10) Patent No.: US 9,852,859 B2
(45) Date of Patent: Dec. 26, 2017

(54) ADJUSTABLE POWER RAIL MULTIPLEXING

(71) Applicant: QUALCOMM Incorporated, San Diego, CA (US)

(72) Inventors: Lipeng Cao, La Jolla, CA (US); Dorav Kumar, San Diego, CA (US); Bilal Zafar, San Diego, CA (US); Ramaprasath Vilangudipitchai, San Diego, CA (US); Venkatasubramanian Narayanan, San Diego, CA (US); Xi Luo, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 253 days.

(21) Appl. No.: 14/981,183

(22) Filed: Dec. 28, 2015

(65) Prior Publication Data

US 2017/0186576 A1 Jun. 29, 2017

(51) Int. Cl.
*H01H 47/00* (2006.01)
*H03K 19/00* (2006.01)

(52) U.S. Cl.
CPC ......... *H01H 47/00* (2013.01); *H03K 19/0008* (2013.01)

(58) Field of Classification Search
CPC combination set(s) only.
See application file for complete search history.

(56) References Cited

U.S. PATENT DOCUMENTS

| 5,650,973 A | 7/1997 | Moyer et al. |
| 7,256,568 B2 | 8/2007 | Lam et al. |
| 7,541,693 B2 | 6/2009 | Huang et al. |
| 7,791,406 B1 | 9/2010 | Wang et al. |

(Continued)

FOREIGN PATENT DOCUMENTS

| EP | 2587672 A2 | 5/2013 |
| WO | 2013100890 A1 | 7/2013 |

OTHER PUBLICATIONS

Cheng W.H., et al., "Dynamic Voltage and Frequency Scaling Circuits with Two Supply Voltages", IEEE International Symposium on Circuits and Systems, ISCAS 2008, Piscataway, NJ, USA, May 18, 2008 (May 18, 2008), pp. 1236-1239, XP031392203, ISBN: 978-1-4244-1683-7.

(Continued)

*Primary Examiner* — An Luu
(74) *Attorney, Agent, or Firm* — Arent Fox, LLP

(57) ABSTRACT

An integrated circuit (IC) is disclosed herein for adjustable power rail multiplexing. In an example aspect, an IC includes a first power rail, a second power rail, and a load power rail. The IC further includes multiple power-multiplexer (power-mux) tiles and adjustment circuitry. The multiple power-mux tiles are coupled in series in a chained arrangement and implemented to jointly perform a power-multiplexing operation. Each power-mux tile is implemented to switch between coupling the load power rail to the first power rail and coupling the load power rail to the second power rail. The adjustment circuitry is implemented (Continued)

to adjust at least one order in which the multiple power-mux tiles perform at least a portion of the power-multiplexing operation.

30 Claims, 19 Drawing Sheets

(56) References Cited

U.S. PATENT DOCUMENTS

| | | | |
|---|---|---|---|
| 8,981,839 B2* | 3/2015 | Kay | H03K 17/687 |
| | | | 307/43 |
| 9,018,893 B2 | 4/2015 | Trock et al. | |
| 9,654,101 B2* | 5/2017 | Cao | H03K 17/693 |
| 2003/0223003 A1 | 12/2003 | Meynants | |
| 2003/0233588 A1 | 12/2003 | Verdun et al. | |
| 2006/0033551 A1 | 2/2006 | Dong et al. | |
| 2008/0270813 A1 | 10/2008 | Yang et al. | |
| 2010/0219866 A1 | 9/2010 | Chen | |
| 2015/0035358 A1* | 2/2015 | Linkhart | H02J 3/006 |
| | | | 307/23 |
| 2015/0048869 A1 | 2/2015 | Huang et al. | |

OTHER PUBLICATIONS

International Search Report and Written Opinion—PCT/US2016/066102—ISA/EPO—Aug. 2, 2017.

Schweizer T., et al., "Low Energy Voltage Dithering in Dual V DD Circuits", Sep. 9, 2009 (Sep. 9, 2009), Integrated Circuit and System Design, Power and Timing Modeling, Optimization and Simulation, Springer Berlin Heidelberg, Berlin, Heidelberg, pp. 237-246, XP019138405, ISBN: 978-3-642-11801-2.

Shi K., et al., "A Wakeup Rush Current and Charge-Up Time Analysis Method for Programmable Power-Gating Designs", IEEE International SOC Conference, Piscataway, NJ, USA, Sep. 26, 2007 (Sep. 26, 2007), pp. 163-165, XP031274150, ISBN: 978-1-4244-1592-2.

Truong D.N., et al., "A 167-Processor Computational Platform in 65 nm CMOS", IEEE Journal of Solid-State Circuits, IEEE Service Center, Piscataway, NJ, USA, vol. 44, No. 4, Apr. 1, 2009 (Apr. 1, 2009), pp. 1130-1144, XP011254308, ISSN: 0018-9200, DOI: 10.1109/JSSC.2009.2013772.

* cited by examiner

ADJUSTABLE POWER RAIL MULTIPLEXING

BACKGROUND

Field of the Disclosure

This disclosure relates generally to power management of integrated circuits (ICs) used in electronic devices and, more specifically, to switching a power source for a circuit to a lower voltage level to reduce power consumption.

Description of Related Art

Power consumption is an increasingly important concern in the design and use of electronic devices. From a global perspective, a multitude of electronic devices available for businesses and consumers consume significant amounts of power. Accordingly, efforts are made to lower the power consumption of electronic devices to help conserve the earth's resources and lower costs for both businesses and consumers. From an individual perspective, the prevalence of electronic devices that are powered by batteries continues to increase. The less energy that is consumed by a portable battery-powered personal computing device, for instance, the longer the portable battery-powered device may operate without recharging the battery. Lower energy consumption also enables the use of smaller batteries and therefore the adoption of smaller and thinner form factors for portable electronic devices. Consequently, the popularity of portable electronic devices also provides a strong motivation to lower the power consumption of electronic devices.

Generally, if an electronic device operates at a lower voltage, the electronic device consumes less power. Hence, one conventional approach to reducing power consumption involves lowering a voltage that powers an electronic device. For example, over the last couple of decades voltages powering integrated circuits (ICs) of electronic devices have been lowered from approximately five volts (5V) to approximately one volt (1V) as process technologies for manufacturing the integrated circuits have advanced. Other conventional approaches have been developed that support the changing of one power supply to different voltage levels at different times. These conventional approaches, however, may use an amount of power that is significantly greater than is necessary to provide different voltages to an integrated circuit.

SUMMARY

In an example aspect, an integrated circuit is disclosed. The integrated circuit includes a first power rail, a second power rail, and a load power rail. The integrated circuit further includes multiple power-multiplexer (power-mux) tiles and adjustment circuitry. The multiple power-mux tiles are coupled in series in a chained arrangement and configured to jointly perform a power-multiplexing operation. Each power-mux tile is configured to switch between coupling the load power rail to the first power rail and coupling the load power rail to the second power rail. The adjustment circuitry is configured to adjust at least one order in which the multiple power-mux tiles perform at least a portion of the power-multiplexing operation. For instance, the adjustment circuitry may be configured to enable adjustment of a control of the multiple power-mux tiles such that at least a portion of the power-multiplexing operation is performed in a sequential order or out of a sequential order.

In an example aspect, an integrated circuit is disclosed. The integrated circuit includes a first power rail, a second power rail, and a load power rail. The integrated circuit also includes multiple power-mux tiles coupled in series in a chained arrangement and configured to perform a power-multiplexing operation including switching between coupling the load power rail to the first power rail and coupling the load power rail to the second power rail. The power-multiplexing operation has at least one order that is determined by the series in which the multiple power-mux tiles are coupled for the chained arrangement. The integrated circuit further includes adjustment means for adjusting the at least one order in which the multiple power-mux tiles are to perform at least a portion of the power-multiplexing operation.

In an example aspect, a method for adjustable power rail multiplexing in an integrated circuit is disclosed. The method includes supplying power to a circuit load via a first power rail while a load power rail is coupled to the first power rail. The method also includes decoupling the load power rail from the first power rail as part of a power multiplexing operation. The method further includes coupling the load power rail to a second power rail as part of the power-multiplexing operation. The method still further includes supplying power to the circuit load via the second power rail while the load power rail is coupled to the second power rail. The method additionally includes, during the power-multiplexing operation, providing a signal to establish a duration of a short circuit current condition between the first power rail and the second power rail.

In an example aspect, an apparatus is disclosed. The apparatus includes a circuit load, a first power rail, a second power rail, and a load power rail that is coupled to the circuit load. The apparatus further includes multiple power-mux tiles and adjustment circuitry. The multiple power-mux tiles are disposed in a chained arrangement. The multiple power-mux tiles are configured to propagate a power rail selection signal between consecutive power-mux tiles in a first direction along the chained arrangement to disconnect the first power rail from the load power rail and to propagate a feedback control signal between consecutive power-mux tiles in a second direction along the chained arrangement to connect the second power rail to the load power rail. The adjustment circuitry is configured to enable establishment of a timing of an occurrence of a connection of the second power rail to the load power rail at a particular power-mux tile of the multiple power-mux tiles.

DETAILED DESCRIPTION

Figure 1:
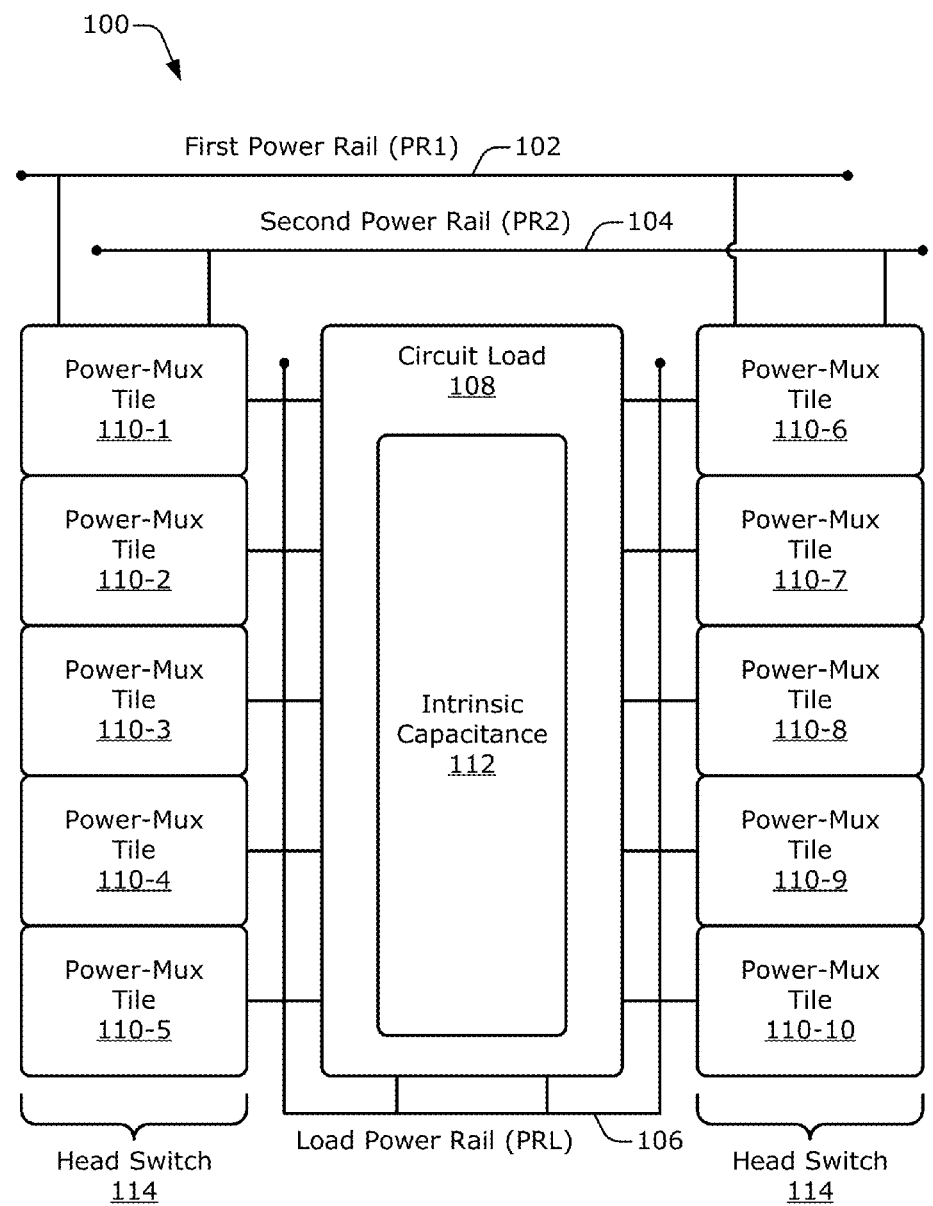
FIG. 1 depicts an example integrated circuit portion that includes multiple power-multiplexer (power-mux) tiles and a circuit load.

Power management of electronic devices entails controlling an amount of power that an integrated circuit (IC) consumes over time or on an instantaneous basis. Power multiplexing techniques may be utilized as part of a power management strategy to provide power reduction opportunities. With power multiplexing, an integrated circuit portion is switched from being powered at one voltage level to being powered at another voltage level. Generally, an integrated circuit portion consumes less energy if operated at a lower voltage level.

Energy consumption can be reduced to zero or near zero during times of nonuse if an integrated circuit is powered down completely. At times of lower utilization or to retain some stored data, an integrated circuit may be powered down to a lower voltage level to reduce power consumption. If an integrated circuit cannot be powered down as a whole, then one or more portions, or cores, may be powered down independently of one another. For example, in the context of a graphics processing unit (GPU), if the integrated circuit chip of the GPU is waiting for additional data or user input before changing a display on a screen, a core of the GPU may be powered down completely. Alternatively, a supply voltage of the GPU core may be lowered. One way to lower the supply voltage is to use power multiplexing techniques to switch the GPU core from one power rail held at one voltage level to another power rail held at another, lower voltage level.

For power multiplexing generally then, a circuit load is multiplexed between multiple power rails with one power rail being held at a voltage level that is lower than the other power rail or rails. The multiplexing between multiple different power rails is effectuated using multiple power-multiplexer tiles (power-mux tiles). With two power rails, for example, each power-multiplexer tile (power-mux tile) includes two switches, such as two transistors, with each switch coupled to one of the two power rails. A power-multiplexing operation entails disconnecting the circuit load from one power rail and connecting the circuit load to another power rail using the two switches and an ordered switching process. If a circuit load occupies a large area of an integrated circuit chip, multiple power-mux tiles may be distributed at different physical locations over the chip to meet current-resistance (IR) drop requirements and to deliver power to different areas of the chip, as will be appreciated by the skilled artisan.

Employing distributed power-mux tiles does enable switching between two different power rails to change voltage levels and therefore reduce power consumption over a large area of an integrated circuit. Unfortunately, scenarios involving distributed power-mux tiles introduce a number of competing problems. First, two different switching transistors coupled to two different power rails of arbitrary voltages cannot both be on at the same time without risking the development of a short-circuit current between the two different power rails, especially if the two different switching transistors are close to each another, such as being part of the same power-mux tile. If two transistors are on, current may flow from one higher-voltage power rail and through one transistor to a common node. From the common node, the current continues to flow through the other transistor and to the other, lower-voltage power rail. A significant amount of power may be drained by a short-circuit current if the short-circuit current condition persists.

Second, the transistors of the distributed power-mux tiles that are coupled to the two different power rails cannot all be off simultaneously for an extended period of time. If all of the transistors are simultaneously off, the circuit load no longer receives power. Consequently, there is an undesirable voltage drop in the circuit load caused by the load current discharging the intrinsic capacitance of the load. This discharging jeopardizes a successful resumption of computing tasks once full power is restored because, for instance, data stored in the circuit load can be lost. Third, if the circuit load is to continue processing during the power-multiplexing operation, the circuit load continues to rely on a periodic clock signal. Disconnecting the circuit load from both power rails is therefore inadvisable because clock pulses cannot be reliably distributed around the circuit load without supplying some amount of power. Handling all three of these competing problems, especially over a large physical area, is challenging.

To at least partially address these problems, multiple power-mux tiles having first and second switches are distributed around a circuit load. The multiple power-mux tiles are coupled between first and second power rails and a load power rail for the circuit load. If two switches that are coupled to different ones of the first and second power rails within a single power-mux tile are both closed, an appreciable short-circuit current develops because a short-circuit conducting path is effectively within the single power-mux tile. However, if two switches that are coupled to different ones of the first and second power rails in different power-mux tiles are both closed, a relatively insignificant short-circuit current may develop between the different power-mux tiles. A short-circuit current condition is created in both situations. The relatively higher level of short-circuit current in the former situation is to be avoided. For the latter situation, on the other hand, a level of the short-circuit current is relatively lower and can be trivial because the short-circuit conducting path between the two closed switches that are coupled to different power rails in different power-mux tiles passes through load circuitry, an intrinsic capacitance of the load circuitry, and a power distribution network. The would-be short circuit current is therefore filtered or reduced by the intervening load circuitry and by the power distribution network's parasitic effects.

With the latter situation, load circuitry is still provided some measure of power, and a trivial short-circuit current between the first and second power rails can be acceptable, particularly if a duration of the short-circuit current condition is properly controlled. In other words, a short-circuit current can be controlled based on distance and intervening circuitry that are between two power-mux tiles having two switches that are closed for different power rails and based on an overlapping time during which both of the two switches are closed. Thus, multiple power-mux tiles can be configurable to adjust a duration of a short-circuit current condition that may be created between the first and second power rails across different power-mux tiles. A length of the duration may be adjusted, for instance, starting from zero and increasable in quantized units of time. The quantized units of time may be independent of a periodic clock signal and based on an intrinsic period of operation for the circuit devices of individual ones of the multiple power-mux tiles.

A timing of a power-multiplexing operation at each individual power-mux tile of a chain of power-mux tiles can be independently controlled as part of a feedback control mechanism. Multiple power-mux tiles are coupled in series in a daisy-chained fashion. The series of power-mux tiles are capable of performing a disconnection portion of the power-multiplexing operation with respect to the first power rail in a fully sequential order. The series of power-mux tiles are further capable of performing a connection portion of the power-multiplexing operation with respect to the second power rail in a reverse of the fully sequential order. If the disconnection and connection portions are both performed in a fully sequential order, then no short-circuit current condition is created.

Adjustment circuitry is configured to manage the series of multiple power-mux tiles for the power-multiplexing operation. The adjustment circuitry generates a feedback adjustment signal that is routed to individual ones of the multiple power-mux tiles. If a feedback adjustment signal is asserted with regard to a particular power-mux tile, then the particular power-mux tile is enabled to perform the connection portion of the power-multiplexing operation out-of-order and early in the reverse sequential order. Because the particular power-mux tile connects the second power rail early and one or more subsequent power-mux tiles are still to uncouple the first power rail from the load power rail, a short-circuit current condition is created between the particular power-mux tile and the subsequent power-mux tiles until the subsequent power-mux tiles complete the disconnection portion of the power-multiplexing operation. As discussed above, the short-circuit current that develops, if any, during the short-circuit current condition has a negligible current level due to the "filtering" by the load circuitry and the intrinsic capacitance thereof, as well as by the parasitic effects of the power distribution network. A number of intervening power-mux tiles between a particular power-mux tile that performs the power rail connecting early and the last power-mux tile of the series at least partially determines a length of the duration of the short-circuit current condition.

In these manners, a duration of a short-circuit current condition that is created during a power-multiplexing operation can be adjusted starting from a length of zero and increasing in quantized time units.

FIG. 1 depicts an example integrated circuit portion 100 that includes multiple power-multiplexer tiles, or power-mux tiles, 110-1 to 110-10. As illustrated, integrated circuit portion 100 includes three power rails: a first power rail 102 (PR1), a second power rail 104 (PR2), and a load power rail 106 (PRL). Integrated circuit portion 100 also includes a circuit load 108, an intrinsic capacitance 112, and a head switch 114, with the head switch 114 including ten power-mux tiles 110-1 to 110-10 as shown. The circuit load 108 may correspond to a core or other block of the integrated circuit. The intrinsic capacitance 112 represents capacitive effects resulting from an architecture or a material used to construct circuit devices of the circuit load 108. For example, metal lines and transistors may have or create an intrinsic capacitance. Although the intrinsic capacitance 112 is illustrated as a monolithic block in FIG. 1, the intrinsic capacitance 112 is actually distributed across the circuit area of the circuit load 108.

The first power rail 102 and the second power rail 104 are held at different voltages by a power management integrated circuit (PMIC), which is not shown. The PMIC may be internal to or external of the same integrated circuit as that of the integrated circuit portion 100. The PMIC is implemented as a voltage source to supply voltages to power rails at specified voltage levels through voltage conversion or regulation. Generally, a head switch is connected between a power rail that is serving as a source voltage and a load that is performing digital processing. For the integrated circuit portion 100, the head switch 114 is connected between the first power rail 102 and the circuit load 108 and between the second power rail 104 and the circuit load 108. The head switch 114 may be implemented using, for example, p-channel or p-type metal-oxide-semiconductor (PMOS) devices that are formed with n-well or n-substrate technology, such as by using multiple p-type field effect transistors (PFETs). The head switch 114 may be realized as a globally distributed head switch (GDHS) or as a block head switch (BHS).

As used herein, the term "mux" refers to a multiplexer. The head switch 114 includes multiple power-mux tiles 110-1 to 110-10. Specifically, power-mux tiles 110-1, 110-2, 110-3, 110-4, 110-5, 110-6, 110-7, 110-8, 110-9, and 110-10 are shown. However, the head switch 114 may include a different number of power-mux tiles 110. Multiple power-mux tiles 110-1 to 110-10 are disposed at least partially around the circuit load 108 in a particular layout as shown, such as along one side or along both sides of the circuit load 108. However, alternative layouts may be implemented. Although some of the multiple power-mux tiles 110-1 to 110-10 are shown as being adjacent to at least one other power-mux tile 110, two or more power-mux tiles 110 may alternatively be disposed in a spaced-apart arrangement.

Although not explicitly illustrated in FIG. 1, the first power rail 102 and the second power rail 104 are both coupled to each power-mux tile 110. Each power-mux tile 110 is further coupled to the load power rail 106. The load power rail 106 is coupled to the circuit load 108. For the integrated circuit portion 100, the first power rail 102 and the second power rail 104 are configured to supply power to the load power rail 106 and thus to the circuit load 108 via the head switch 114 using the multiple power-mux tiles 110-1 to 110-10. In operation, each power-mux tile 110 is configured to switch from using the first power rail 102 to using the second power rail 104, and vice versa, to supply power to the circuit load 108 via the load power rail 106. An arrangement of multiple power-mux tiles, along with power-mux circuitry and adjustment circuitry, is shown in FIG. 2.

Figure 2:
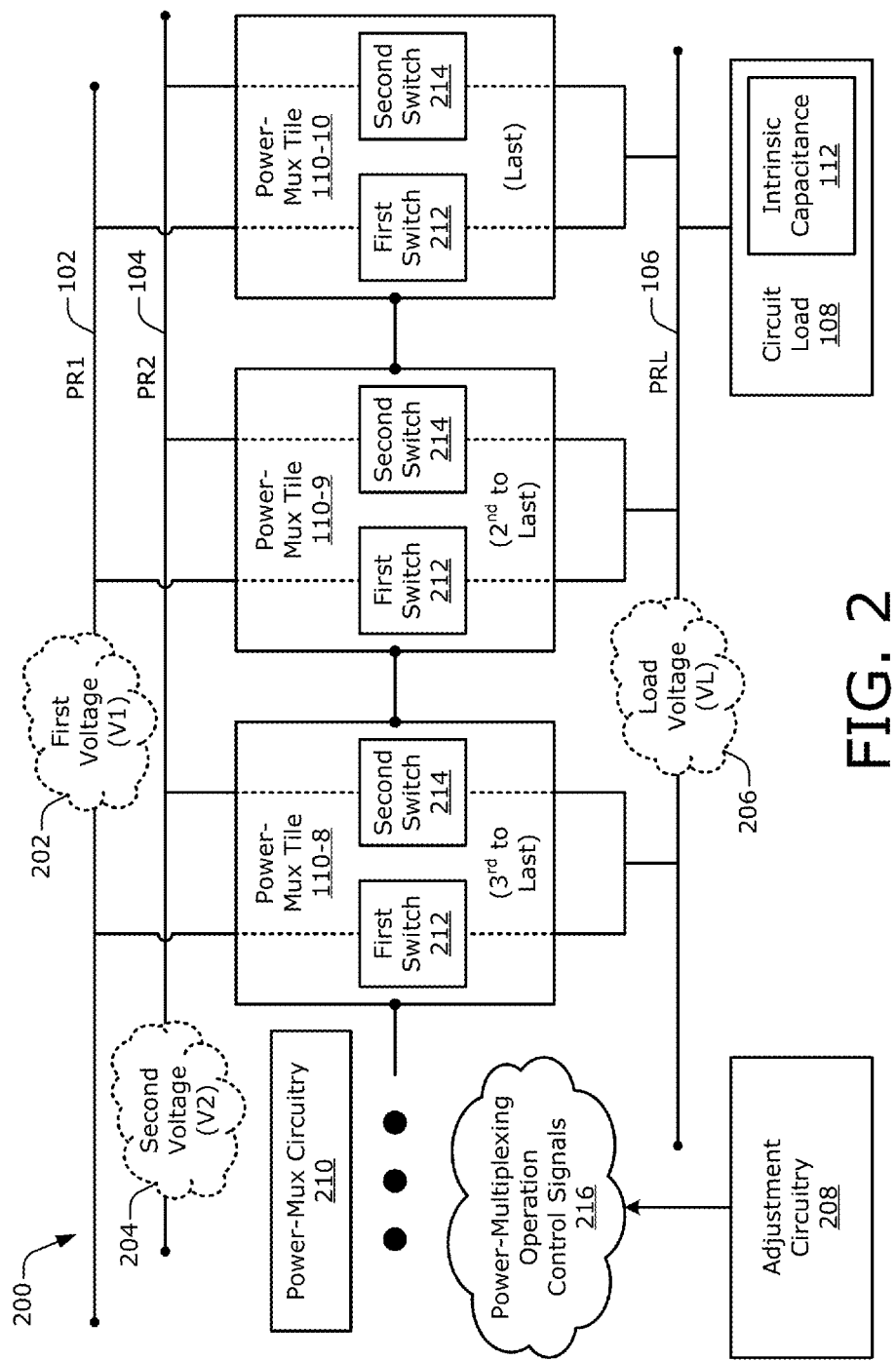
FIG. 2 depicts an example chained arrangement of multiple power-mux tiles, which include internal switches coupled to power rails, in conjunction with power-mux circuitry and adjustment circuitry.

FIG. 2 depicts an example chained arrangement 200 of multiple power-mux tiles, which include internal switches coupled to power rails, in conjunction with power-mux circuitry 210 and adjustment circuitry 208. Of the ten power-mux tiles depicted in FIG. 1, three power-mux tiles 110-8, 110-9, and 110-10 are explicitly shown. FIG. 2 also depicts the first power rail 102, the second power rail 104, the load power rail 106, the circuit load 108, and the intrinsic capacitance 112. FIG. 2 shows a first voltage 202 (V1), a second voltage 204 (V2), a load voltage 206 (VL), adjustment circuitry 208, power-mux circuitry 210, and power-multiplexing operation control signals 216. Each power-mux tile 110 is depicted as including a first switch 212 and a second switch 214. The first power rail 102 can be held at the first voltage 202, and the second power rail 104 can be held at the second voltage 204. For example, a first power supply or power regulator (not shown) can maintain the first voltage 202 on the first power rail 102, and a second power supply or power regulator (not shown) can maintain the second voltage 204 on the second power rail 104. The load power rail 106 can be held at the load voltage 206. For example, if one or more of the power-mux tiles connects the first power rail 102 to the load power rail 106, the load power rail 106 may be at the first voltage 202, and if one or more power-mux tiles connect the second power rail 104 to the load power rail 106, the load power rail 106 may be at the second voltage 204.

The multiple power-mux tiles 110-1 to 110-10 can be coupled in series. The terminating power-mux tile in the series, the power-mux tile 110-10, is called the "last" power-mux tile herein. Thus, the power-mux tile 110-9 is called the "second-to-last" power-mux tile, and the power-mux tile 110-8 is called the "third-to-last" power-mux tile. Referring now to the power-mux tiles explicitly shown in FIG. 2, each of the power-mux tiles 110-8, 110-9, and 110-10 is coupled to both the first power rail 102 and the second power rail 104. Each of the power-mux tiles 110-8, 110-9, and 110-10 is also coupled to the load power rail 106. The load power rail 106 is coupled to the circuit load 108, which includes the intrinsic capacitance 112. Each first switch 212 is coupled between the first power rail 102 and the load power rail 106, and each second switch 214 is coupled between the second power rail 104 and the load power rail 106.

Although depicted as discrete boxes, the power-mux circuitry 210 or the adjustment circuitry 208 may be distributed across the multiple power-mux tiles 110-1 to 110-10. A portion of the power-mux circuitry 210 or the adjustment circuitry 208 may be disposed internal to each power-mux tile 110. Additionally or alternatively, a portion of the power-mux circuitry 210 or the adjustment circuitry 208 may be disposed external to the multiple power-mux tiles 110-1 to 110-10, such as between or among the multiple power-mux tiles 110-1 to 110-10 to propagate one or more control signals. Although depicted separately, the adjustment circuitry 208 may be integrated with, including by being a part of, the power-mux circuitry 210.

In an example operation, the power-mux circuitry 210 causes the power-mux tiles 110-1 to 110-10 to switch from coupling the load power rail 106 to the first power rail 102 to coupling the load power rail 106 to the second power rail 104. This power source switching is performed by sequentially opening the first switches 212 from the power-mux tile 110-1, which is not explicitly shown in FIG. 2, to the last power-mux tile 110-10 and then sequentially closing the second switches 214 from the last power-mux tile 110-10 to the power-mux tile 110-1. If the switches are implemented as transistors, an open switch corresponds to a transistor that is off, and a closed switch corresponds to a transistor that is turned on.

By opening the first switches 212 before closing the second switches 214, a first switch 212 and a second switch 214 are not simultaneously closed, so a short-circuit current condition may be prevented. In this example manner, no short-circuit current is permitted to flow between the first power rail 102 and the second power rail 104. In other words, no short-circuit current is permitted to flow from the first power rail 102 to the second power rail 104 if the first voltage 202 is greater than the second voltage 204 or from the second power rail 104 to the first power rail 102 if the second voltage 204 is greater than the first voltage 202. Additionally, by sequentially closing the second switches 214, power is applied to the circuit load 108 in stages such that a size of an undesirable voltage droop along the load power rail 106 may be at least reduced.

The adjustment circuitry 208 may be implemented in one mode to selectively enable prevention of a short-circuit current condition as described above. However, the adjustment circuitry 208 may further be implemented in another mode to enable the creation of a short-circuit current condition for a selectable or determinable duration. In other words, the adjustment circuitry 208 can manage the multiple power-mux tiles 110-1 to 110-10 to enable adjustment of a duration of a short-circuit current condition. The adjustment circuitry 208 generates power-multiplexing operation control signals 216 and distributes the signals to the multiple power-mux tiles 110-1 to 110-10 to manage a power-multiplexing operation. An example duration of a short-circuit current condition created during a power-multiplexing operation is described with reference to FIG. 3 below.

Figure 3:
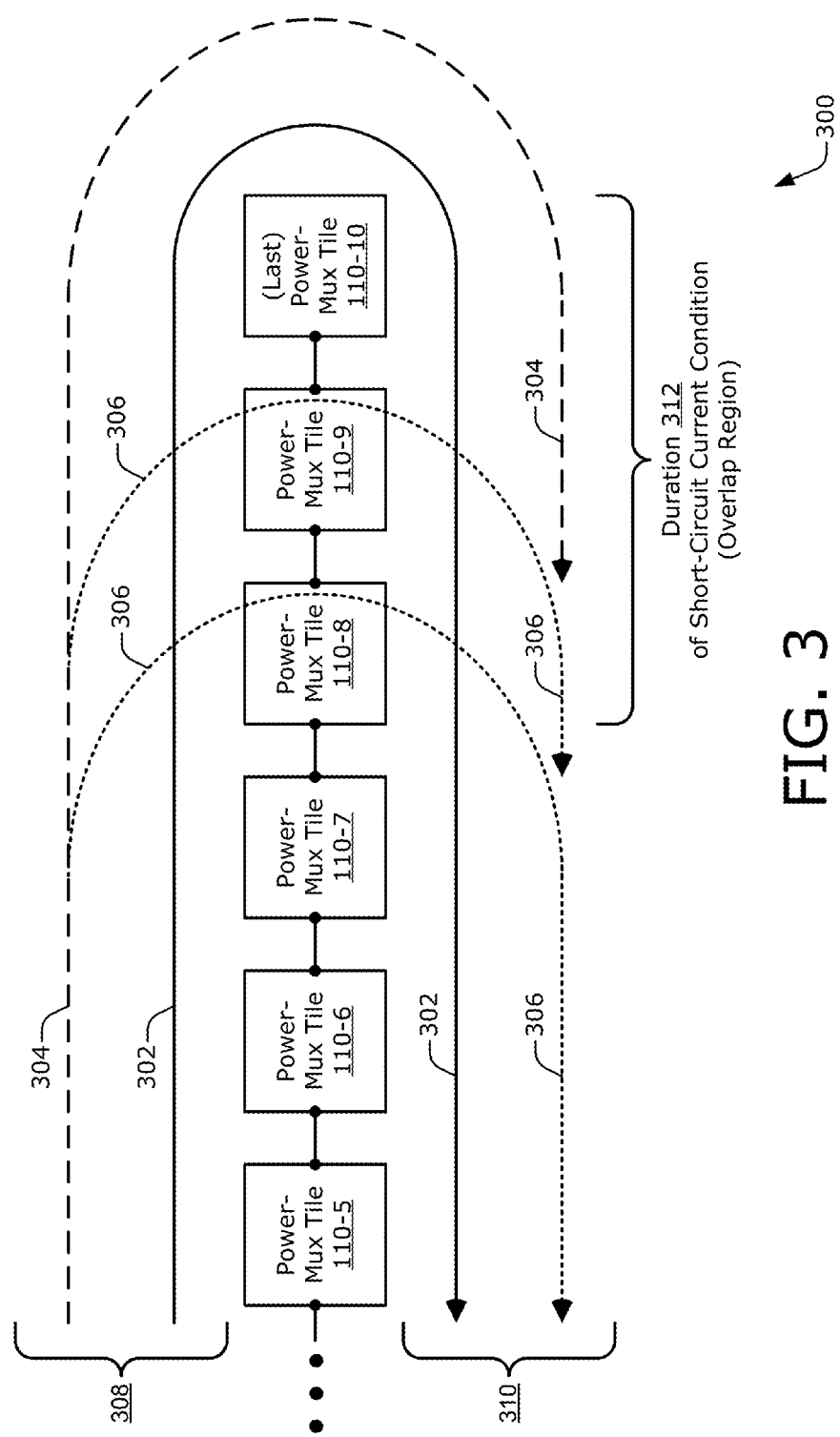
FIG. 3 illustrates example orders for a power-multiplexing operation that is performed by multiple power-mux tiles that are coupled in series.

FIG. 3 illustrates example orders for a power-multiplexing operation 300 that is performed by multiple power-mux tiles that are coupled in series. Of the ten power-mux tiles depicted in FIG. 1, six power-mux tiles 110-5, 110-6, 110-7, 110-8, 110-9, and 110-10 are explicitly shown. FIG. 3 further depicts a disconnection portion 308 and a connection portion 310 of the power-multiplexing operation 300. Different example orders for the power-multiplexing operation 300 are represented by an arrow 302, an arrow 304, and an arrow 306. A duration 312 of a short-circuit current condition is also indicated.

To represent actions for one or more embodiments, the arrows 302, 304, and 306 indicate example progressions for the overall power-multiplexing operation 300 at individual power-mux tiles. The disconnection portion 308 of the power-multiplexing operation 300 is indicated above the chained series of power-mux tiles, and the connection portion 310 is indicated below the chained series of power-mux tiles. Specifically, a disconnection of the load power rail 106 from the first power rail 102 is indicated above the chained series, and a connection of the load power rail 106 to the second power rail 104 is indicated below the chained series.

The arrow 302, which is formed from a solid line, represents a sequential order in which no power-mux tile 110 is enabled to close a second switch 214, which would connect the second power rail 104 to the load power rail 106, at a time that would deviate from a fully-sequential order. Hence, each first switch 212 is opened from left to right, and each second switch 214 is closed from right to left. This fully-sequential approach of the arrow 302 prevents any second switch 214 from being closed if a first switch 212, anywhere along the chained series, is still closed. Consequently, a short-circuit current condition between the first power rail 102 and the second power rail 104 is prevented. For example, if the power-mux circuitry 210 (e.g., of FIG. 2) implements a fully-sequential power-multiplexing operation 300 such that no second switch 214 is permitted to be closed while a first switch 212 remains closed, or vice versa, the power-mux circuitry 210 prevents development of a short-circuit current condition between the first power rail 102 and the second power rail 104.

However, completely disconnecting the circuit load 108 from both the first power rail 102 and the second power rail 104 is not feasible unless the clock signal to the circuit load 108 is gated. If processing is to be continued reliably during the power-multiplexing operation 300, some power is to be provided to the circuit load 108 during the power-multiplexing operation 300 by temporarily permitting at least one first switch 212 and at least one second switch 214 (e.g., of different power-mux tiles) to both be closed for some period of time. To do so, a selected power-mux tile 110 is enabled to perform the connection portion 310 of the power-multiplexing operation 300 out of sequence.

The arrows 304 and 306, which are formed from dashed lines, represent a power-multiplexing order if at least one power-mux tile is enabled to close a second switch 214 in a non-sequential order. More specifically, the arrow 304 with the larger dashes represents a sequential order for opening the first switches 212 of the multiple power-mux tiles 110-1 to 110-10 to disconnect the first power rail 102 from the load power rail 106 from left to right. The curvature of the arrow 304 around the last power-mux tile 110-10 further represents how the second switch 214 of the last power-mux tile 110-10 is closed after the first switch 212 thereof is opened. The sequential order may continue in reverse from the last power-mux tile 110-10 going from right to left in which the second switches 214 of the multiple power-mux tiles 110-10 to 110-1 are closed to connect the second power rail 104 to the load power rail 106.

One or more particular power-mux tiles, however, may be selected for performing the power rail switching out of the sequential order. The arrows 306 represent where, e.g. at which power-mux tile or tiles, the second switch is enabled to be closed at a timing that is outside of the reverse fully sequential order. An identified temporal overlap region is indicative of the duration 312 in which at least one second switch 214 and at least one first switch 212 of different power-mux tiles are simultaneously closed. As shown, two power-mux tiles—the second-to-last power-mux tile 110-9 and the third-to-last power-mux tile 110-8—are enabled to perform the connection portion 310 of the power-multiplexing operation 300 out of a fully sequential order. Thus, the second switch 214 of the power-mux tile 110-8 may be closed while the first switch 212 of the power-mux tile 110-9 or 110-10 is or are also closed. Similarly, the second switch 214 of the power-mux tile 110-9 may be closed while the first switch 212 of the power-mux tile 110-10 is also closed. For the duration 312 of the temporal overlap region, the short-circuit current condition pertains to a potential short-circuit current that is substantially filtered by the load circuitry, the intrinsic capacitance of the load circuitry, and the parasitic effects of the power distribution network.

In an example implementation, the adjustment circuitry 208 of FIG. 2 provides adjustment means for adjusting the at least one order in which the multiple power-mux tiles 110-1 to 110-10 are to perform at least a portion of the power-multiplexing operation 300, with the portion including the disconnection portion 308 or the connection portion 310. As will be apparent from the discussion below, a different number of power-mux tiles 110 from the two that are shown may alternatively be enabled to connect the second power rail to the load power rail out of order. Moreover, the power-mux tile or tiles 110 that are so enabled need not be immediately prior, in the direction of the disconnection portion 308, to the last power-mux tile 110-10. Furthermore, if multiple power-mux tiles 110 are enabled to connect the second power rail to the load power rail out of order, the power-mux tiles 110 that are so enabled need not be consecutive with one another.

Figure 4:
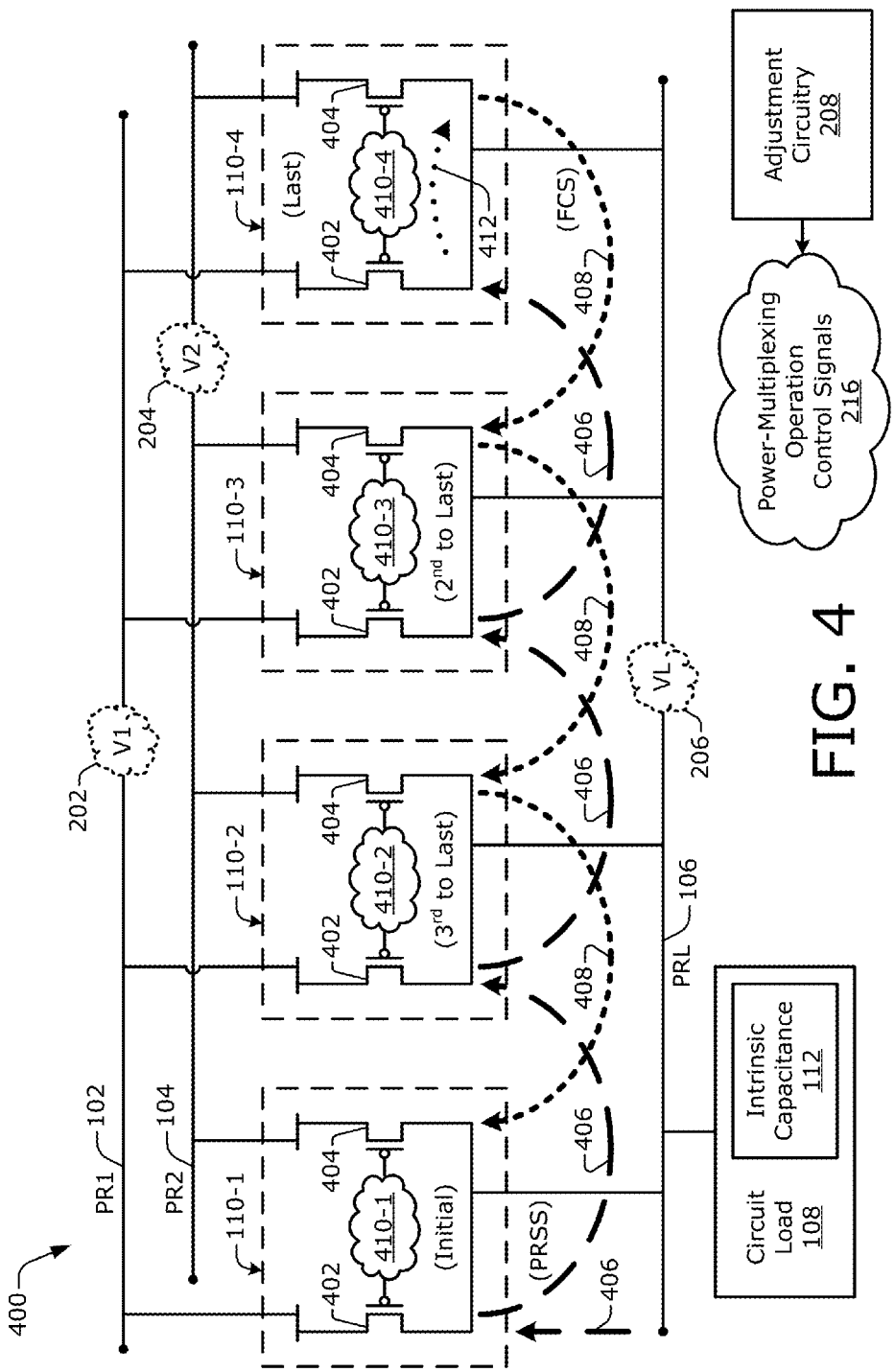
FIG. 4 depicts an example chained arrangement of multiple power-mux tiles, each of which include two transistors and a delay control circuit, that are manageable by adjustment circuitry using example power-multiplexing operation control signals.

FIG. 4 depicts an example chained arrangement 400 of multiple power-mux tiles 110-1 to 110-4, each of which include two transistors and a delay control circuit, that are manageable by the adjustment circuitry 208 using example power-multiplexing operation control signals 216. FIG. 4 includes the first power rail 102 at the first voltage 202, the second power rail 104 at the second voltage 204, and the load power rail 106 at the load voltage 206. FIG. 4 further includes the circuit load 108 having the intrinsic capacitance 112 and four power-mux tiles 110-1 to 110-4. In an example implementation shown in FIG. 4, four power-mux tiles 110-1 to 110-4 are used to describe a power-multiplexing operation with an initial power-mux tile 110-1 and a terminating or last power-mux tile 110-4, as well as two power-mux tiles that are internal to the chained arrangement 400. The chained arrangement 400 includes four first transistors 402, four second transistors 404, and a set of delay control circuits 410-1 to 410-4.

As illustrated, each respective power-mux tile 110 includes a first transistor 402, a second transistor 404, and a delay control circuit 410. Specifically, the initial power-mux tile 110-1 includes a first transistor 402, a second transistor 404, and a delay control circuit 410-1. The third-to-last power-mux tile 110-2 includes a first transistor 402, a second transistor 404, and a delay control circuit 410-2. The second-to-last power-mux tile 110-3 includes a first transistor 402, a second transistor 404, and a delay control circuit 410-3. The last power-mux tile 110-4 includes a first transistor 402, a second transistor 404, and a delay control circuit 410-4. The first switches 212 of FIG. 2 may be implemented as the first transistors 402, and the second switches 214 of FIG. 2 may be implemented as the second transistors 404. The power-mux circuitry 210 of FIG. 2 may include the four delay control circuits 410-1 to 410-4.

Multiple power-mux tiles 110-1 to 110-4 are coupled in series or configured in a chained arrangement. Each respective power-mux tile 110 includes a respective first transistor 402 and a respective second transistor 404. At least part of the power-mux circuitry 210 of FIG. 2 is distributed across the chained arrangement of the multiple power-mux tiles 110-1 to 110-4 as the delay control circuit 410-1, the delay control circuit 410-2, the delay control circuit 410-3, and the delay control circuit 410-4. The first transistors 402 are associated with and coupled to the first power rail 102, and the second transistors 404 are associated with and coupled to the second power rail 104.

In one or more embodiments, each first transistor 402 and each second transistor 404 comprises a PFET transistor, which may comprise a transistor that is configured to turn power on or turn power off for the load power rail 106 to supply a voltage to the circuit load 108. Sizes of the first transistors 402 or the second transistors 404 may be scaled in accordance with a specified current or power level. The first transistors 402 are coupled between the first power rail 102 and the load power rail 106. The second transistors 404 are coupled between the second power rail 104 and the load power rail 106. More specifically, each first transistor 402 may be coupled to the first power rail 102 and to the load power rail 106 at the source and drain terminals of the transistor. Each second transistor 404 may be coupled to the second power rail 104 and to the load power rail 106 at the source and drain terminals of the transistor.

For each power-mux tile 110, a part of the power-mux circuitry 210 of FIG. 2 may be coupled between a gate terminal of the first transistor 402 and a gate terminal of the second transistor 404. A respective delay control circuit 410 of the set of delay control circuits 410-1 to 410-4 is coupled between a respective first transistor 402 and a respective second transistor 404. Specifically, the delay control circuit 410-1 is coupled between the gate terminals of the first transistor 402 and the second transistor 404 of the power-mux tile 110-1. The delay control circuit 410-2 is coupled between the gate terminals of the first transistor 402 and the second transistor 404 of the power-mux tile 110-2. The delay control circuit 410-3 is coupled between the gate terminals of the first transistor 402 and the second transistor 404 of the power-mux tile 110-3. The delay control circuit 410-4 is coupled between the gate terminals of the first transistor 402 and the second transistor 404 of the power-mux tile 110-4.

In an example operation, the power-mux circuitry 210 of FIG. 2 is configured to switch from coupling the first power rail 102 to the load power rail 106 to coupling the second power rail 104 to the load power rail 106. The power-mux circuitry 210 switches access to power for the load power rail 106 from the first power rail 102 to the second power rail 104 by sequentially turning off the first transistors 402 and then at least partially sequentially turning on the second transistors 404. For example, the power multiplexer circuitry 210 may be configured to disconnect the load power rail 106 from the first power rail 102 and to connect the load power rail 106 to the second power rail 104 by sequentially turning off the first transistors 402 and then at least partially sequentially turning on the second transistors 404.

The power-mux circuitry 210 of FIG. 2 may include a delay control circuit 410-1, a delay control circuit 410-2, a delay control circuit 410-3, and a delay control circuit 410-4 as distributed across the chained arrangement 400 at individual ones of the multiple power-mux tiles 110-1 to 110-4. The power-mux circuitry 210 may be configured by the adjustment circuitry 208 to sequentially turn off the first transistors 402 in a first order. If a short-circuit current condition is to be prevented, the power-mux circuitry 210 thereafter sequentially turns on the second transistors 404 in a second order, with the second order being a reverse of the first order. An example of a sequential approach to turning on the first transistors 402 and then turning off the second transistors 404 of the multiple power-mux tiles 110-1 to 110-4 is described below.

In an example implementation, the power-mux circuitry 210 is also configured to switch from coupling the second power rail 104 to the load power rail 106 back to coupling the first power rail 102 to the load power rail 106. The power-mux circuitry 210 switches access to power for the load power rail 106 from the second power rail 104 to the first power rail 102 by sequentially turning off the second transistors 404 and then at least partially sequentially turning on the first transistors 402. For example, the power multiplexer circuitry 210 may be configured to disconnect the load power rail 106 from the second power rail 104 and to connect the load power rail 106 back to the first power rail 102 by sequentially turning off the second transistors 404 and then at least partially sequentially turning on the first transistors 402.

Although the first transistor 402 and the second transistor 404 are shown and described herein as p-type FET (PFET) transistors, other transistor types may alternatively be implemented. For example, an n-type FET (NFET) may be used. An NFET transistor is utilized if a foot switch mechanism, for instance, is employed to provide power to a load on an integrated circuit chip instead of a head switch mechanism as shown in FIGS. 1 and 4. A PFET may be implemented using a p-channel device that is formed with n-well or n-substrate technology. An NFET, on the other hand, may be implemented using an re-channel device that is formed with p-well or p-substrate technology. Alternatively, a bipolar junction transistor (BJT) may be used.

As shown in FIG. 4, the delay control circuits 410-1, 410-2, 410-3, and 410-4 are represented as part of respective ones of the power-mux tiles 110-1, 110-2, 110-3, and 110-4. However, at least part of the power-mux circuitry 210 of FIG. 2 may alternatively or additionally be located apart from a power-mux tile 110. For example, parts of the adjustment circuitry 208 may be disposed external to the power-mux tiles as described below.

In one or more embodiments, the adjustment circuitry 208 produces the power-multiplexing operation control signals 216 to manage the multiple power-mux tiles 110-1 to 110-4 for a power-multiplexing operation. Examples of the power-multiplexing operation control signals 216 include a power rail selection signal 406 (PRSS) and a feedback control signal 408 (FCS). A delay signal 412 may be generated by some other portion of the power-mux circuitry 210, such as the delay control circuit 410-4. During a power-multiplexing operation, the multiple power-mux tiles 110-1 to 110-4 undergo a number of different states. These states correspond to different times as the power-mux circuitry 210 switches from supplying power to the load power rail 106 with the first power rail 102 using multiple first transistors 402 to supplying power to the load power rail 106 with the second power rail 104 using multiple second transistors 404.

In a first example operational steady-state condition, the load power rail 106 is being powered by the first power rail 102. The first transistors 402 of the multiple power-mux tiles 110-1 to 110-4 are in an ON operational state. Hence, current is permitted to flow from the first power rail 102 through the first transistors 402 to the load power rail 106. The load voltage 206 of the load power rail 106 is established to equal the first voltage 202 of the first power rail 102. The second transistors 404 of the multiple power-mux tiles 110-1 to 110-4 are in an OFF operational state.

In a first example transitional state, the first transistors 402 are being turned off sequentially across the multiple power-mux tiles 110-1 to 110-4. More specifically, the first transistor 402 of the initial power-mux tile 110-1 is turned off first. Next, the first transistor 402 of the third-to-last power-mux tile 110-2 is turned off, and then the first transistor 402 of the second-to-last power-mux tile 110-3 is turned off. Finally, the first transistor 402 of the last power-mux tile 110-4 is turned off.

A power rail selection signal 406 (PRSS) can select between or among two or more different power rails. In this example, the power rail selection signal 406, which may comprise one or more bits, selects between the first power rail 102 and the second power rail 104. The initial power-mux tile 110-1 receives the power rail selection signal 406 to initiate a power-multiplexing operation. The power rail selection signal 406 propagates to additional power-mux tiles sequentially. More specifically, the power rail selection signal 406 propagates to power-mux tile 110-2, then to power-mux tile 110-3, and finally to power-mux tile 110-4. At each respective power-mux tile 110, the power rail selection signal 406 causes the power-mux tile 110 to turn off the first transistor 402 as part of the first transitional state.

In a second example transitional state, the first transistors 402 of the multiple power-mux tiles 110-1 to 110-4 are in an OFF operational state. Hence, current is blocked from flowing from the first power rail 102 through the first transistors 402 to the load power rail 106. The second transistors 404 of the multiple power-mux tiles 110-1 to 110-4 are also in an OFF operational state. Hence, current is blocked from flowing from the second power rail 104 through the second transistors 404 to the load power rail 106. No short-circuit current condition is created, which prevents a rapid consumption of power due to a short-circuit current. The load voltage 206 of the load power rail 106 is in an indeterminate state, but the load voltage 206 is decreasing and dropping toward a ground level. During the second transitional state, processing or memory retention viability of the circuit load 108 may be maintained by the intrinsic capacitance 112, but just for a finite period of time that may not sufficient in certain circumstances depending on the circuit load 108.

During the second transitional state, the delay signal 412 propagates through the delay control circuit 410-4 of the last power-mux tile 110-4. The delay signal 412 takes a certain amount of time, such as 40-60 picoseconds, to propagate through the delay control circuit 410-4 such that there is a delay between when the first transistor 402 of the power-mux tile 110-4 is turned off and when the second transistor 404 of the power-mux tile 110-4 is turned on. In effect, the delay control circuit 410-4 may be configured to prevent the second transistor 404 from being turned on if the first transistor 402 is still on. An example of a delay control circuit 410 is described herein with reference to FIGS. 12-16.

In a third example transitional state, the second transistors 404 are being turned on sequentially across the multiple power-mux tiles from 110-4 to 110-1, so the turning on order of the second transistors 404 is reversed as compared to the turning off order of the first transistors 402 across the series of the multiple power-mux tiles 110-1 to 110-4. After the delay signal 412 propagates through the delay control circuit 410-4, the second transistor 404 of the last power-mux tile 110-4 is turned on. The second transistor 404 of the second-to-last power-mux tile 110-3 is turned on next, and then the second transistor 404 of the third-to-last power-mux tile 110-2 is turned on. Finally, the second transistor 404 of the initial power-mux tile 110-1 is turned on. The second transistors 404 of the multiple power-mux tiles 110-1 to 110-4 may be turned on in stages to manage the in-rush of current to the circuit load 108 and to prevent, or to at least reduce, a voltage droop of the second voltage 204 of the second power rail 104.

A feedback control signal 408 (FCS) can enable or cause a transistor of a consecutive power-mux tile 110 to be turned on. In FIG. 4, the feedback control signal 408, which may comprise one or more bits, is forwarded to a succeeding power-mux tile 110 after a second transistor 404 of a preceding consecutive power-mux tile 110 is turned on. After the delay signal 412 propagates through the delay control circuit 410-4 of the last power-mux tile 110-4, the second transistor 404 of the power-mux tile 110-4 is turned on. In response to the second transistor 404 of the last power-mux tile 110-4 being turned on, the feedback control signal 408 is provided to the second-to-last power-mux tile 110-3 to continue the power-multiplexing operation.

In response to receiving an asserted or logical high version of the feedback control signal 408, the delay control circuit 410-3 turns on the second transistor 404 of the power-mux tile 110-3. The feedback control signal 408 is propagated to additional consecutive power-mux tiles in a serial order to enable turning on additional ones of the second transistors 404. The feedback control signal 408 is propagated from the second-to-last power-mux tile 110-3 to the third-to-last power-mux tile 110-2, and then from the power-mux tile 110-2 to the power-mux tile 110-1.

In an example second operational steady-state condition, the load power rail 106 is being powered by the second power rail 104. The first transistors 402 of the multiple power-mux tiles 110-1 to 110-4 are in an OFF operational state. The second transistors 404 of the multiple power-mux tiles 110-1 to 110-4, however, are in an ON operational state. Hence, current is permitted to flow from the second power rail 104 through the second transistors 404 to the load power rail 106. The load voltage 206 of the load power rail 106 is established to equal the second voltage 204 of the second power rail 104.

The multiple power-mux tiles 110-1 to 110-4 of FIG. 4 illustrate examples of 2-to-1 power multiplexing. However, the power multiplexer control techniques described herein can be applied in various scenarios including, by way of example but not limitation, with 3-to-1 power-mux tiles, with 4-to-1 power-mux tiles, and in general with n-to-1 power-mux tiles. For example, although not shown in FIG. 4, an integrated circuit may further include a third power rail for use with 3-to-1 power-mux tiles. With three power rails, each power-mux tile of the multiple power-mux tiles is implemented to switch between coupling the load power rail to the first power rail or the second power rail and coupling the load power rail to the third power rail. In addition, there is no restriction with respect to the voltage relationship between different power rails that are coupled to the multiple power-mux tiles.

Implementations described above with reference to FIG. 4 focus on a power-multiplexing operation that is effectuated in a fully sequential manner, both for the disconnection portion and the connection portion. For implementations in which at least the connection portion is effectuated out of a sequential order, the adjustment circuitry 208 modifies the power-multiplexing operation control signals 216. For example, the adjustment circuitry 208 can adjust the feedback control signal 408 at least for those one or more respective power-mux tiles 110 that are to perform a respective individual part of the connection portion of the power-multiplexing operation out of the sequential order.

In an example implementation, the adjustment circuitry 208 is configured to advance a timing of an occurrence of a connection of the second power rail 104 to the load power rail 106 at a particular power-mux tile (e.g., the third-to-last power-mux tile 110-2) so as to transpire prior to an occurrence of a connection of the second power rail 104 to the load power rail 106 at the last power-mux tile 110-4. Additionally or alternatively, the adjustment circuitry 208 is configured to advance a timing of an occurrence of a connection of the second power rail 104 to the load power rail 106 at a particular power-mux tile (e.g., the third-to-last power-mux tile 110-2) so as to transpire prior to an occurrence of a disconnection of the first power rail 102 from the load power rail 106 at the last power-mux tile 110-4. In this manner, the first power rail 102 and the second power rail 104 are simultaneously coupled to the load power rail 106, but via switches that are located in different power-mux tiles. Example approaches to advancing the timing of connection occurrences for individual power-mux tiles are described below with reference to FIGS. 5 and 6.

Figure 5:
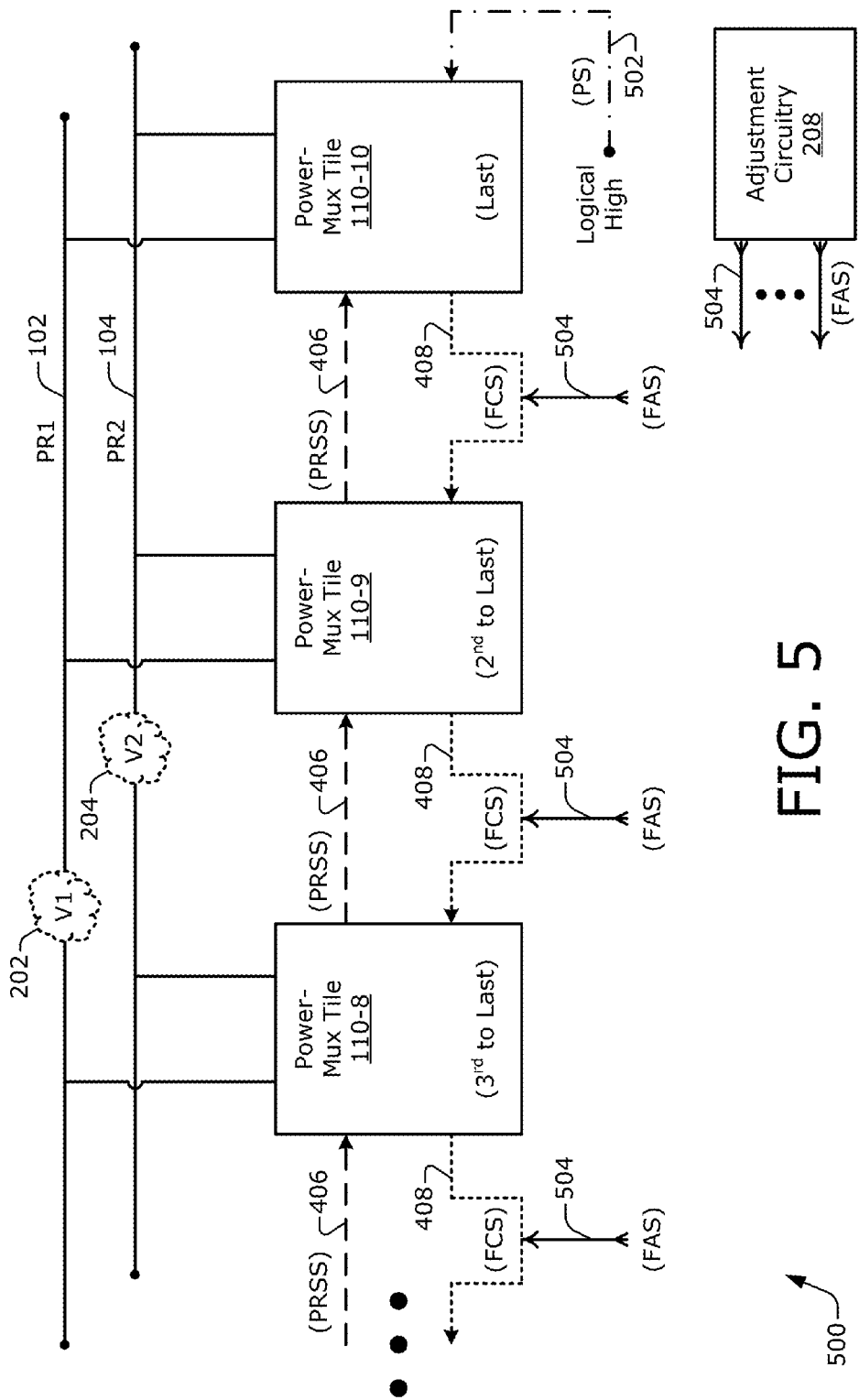
FIG. 5 depicts a series of power-mux tiles through which power-multiplexing operation control signals, including an example feedback adjustment signal, are propagated.

FIG. 5 depicts a series of power-mux tiles through which power-multiplexing operation control signals, including an example feedback adjustment signal 504 (FAS), are propagated. Of the ten power-mux tiles depicted in FIG. 1, three power-mux tiles 110-8, 110-9, and 110-10 are explicitly shown. FIG. 5 also shows the first power rail 102 at the first voltage 202, the second power rail 104 at the second voltage 204, and the adjustment circuitry 208. FIG. 5 further includes the power rail selection signal 406 (PRSS), the feedback control signal 408 (FCS), and a preset signal 502 (PS), as well as the feedback adjustment signal 504.

In one or more embodiments, the adjustment circuitry 208 propagates the power rail selection signal 406 in a serial order across the series of power-mux tiles that are coupled in a chained arrangement, including from the third-to-last power-mux tile 110-8 to the second-to-last power-mux tile 110-9 and from the second-to-last power-mux tile 110-9 to the last power-mux tile 110-10. The power rail selection signal 406 causes each power-mux tile 110 to disconnect the first power rail 102 from the load power rail 106 of FIG. 4 by opening a switch 212 of FIG. 2. In this example manner, the power rail selection signal 406 and related propagation or control sequence hardware provide means for controlling a decoupling of the load power rail 106 from the first power rail 102 in a sequential order along the series in which the multiple power-mux tiles 110-1 to 110-10 are coupled. After the disconnection portion 308 of the power-multiplexing operation 300 of FIG. 3 at each individual power-mux tile 110, the connection portion 310 can begin if the feedback control signal 408 is in the correct state. A given power-mux tile 110 is delayed from connecting the second power rail 104 to the load power rail 106 until an incoming feedback control signal 408 is asserted or set to a logical high.

The last power-mux tile 110-10 is provided the preset signal 502 that is set to a logical high value, such as by being tied to a power supply. The last power-mux tile 110-10 can therefore switch from coupling the first power rail 102 to the load power rail 106 to coupling the second power rail 104 to the load power rail 106 responsive to receipt of the power rail selection signal 406. After the second switch 214 (of FIG. 2) of the last power-mux tile 110-10 is closed, the power-mux tile 110-10 asserts an outgoing feedback control signal 408 by driving it to a logical high. Responsive to an asserted feedback control signal 408, the second-to-last power-mux tile 110-9 is enabled to close the second switch 214 of the power-mux tile 110-9. The adjustment circuitry 208 continues to propagate the feedback control signal 408 from right to left in this manner in a fully sequential order from the second-to-last power-mux tile 110-9 to the initial power-mux tile 110-1. However, the adjustment circuitry 208 can provide a signal to selectively enable a tile of the multiple power-mux tiles 110-1 to 110-10 to couple the second power rail 104 to the load power rail 106 out of the serial order. In this example manner, the feedback control signal 408 and related propagation or control sequence hardware that impact a value of the feedback control signal 408 provide means for controlling a coupling of the load power rail 106 to the second power rail 104 in a selectable order.

In example implementations, the adjustment circuitry 208 generates the feedback adjustment signal 504 and propagates the feedback adjustment signal 504 to one or more power-mux tiles 110. The feedback adjustment signal 504 can control the feedback control signal 408 so as to be asserted and thus provide a logical high value to the succeeding power-mux tile 110. If the feedback control signal 408 is asserted at the input of a particular power-mux tile 110, and the first switch 212 thereof is open, then the particular power-mux tile 110 is enabled to close the second switch 214 thereof.

Figure 6:
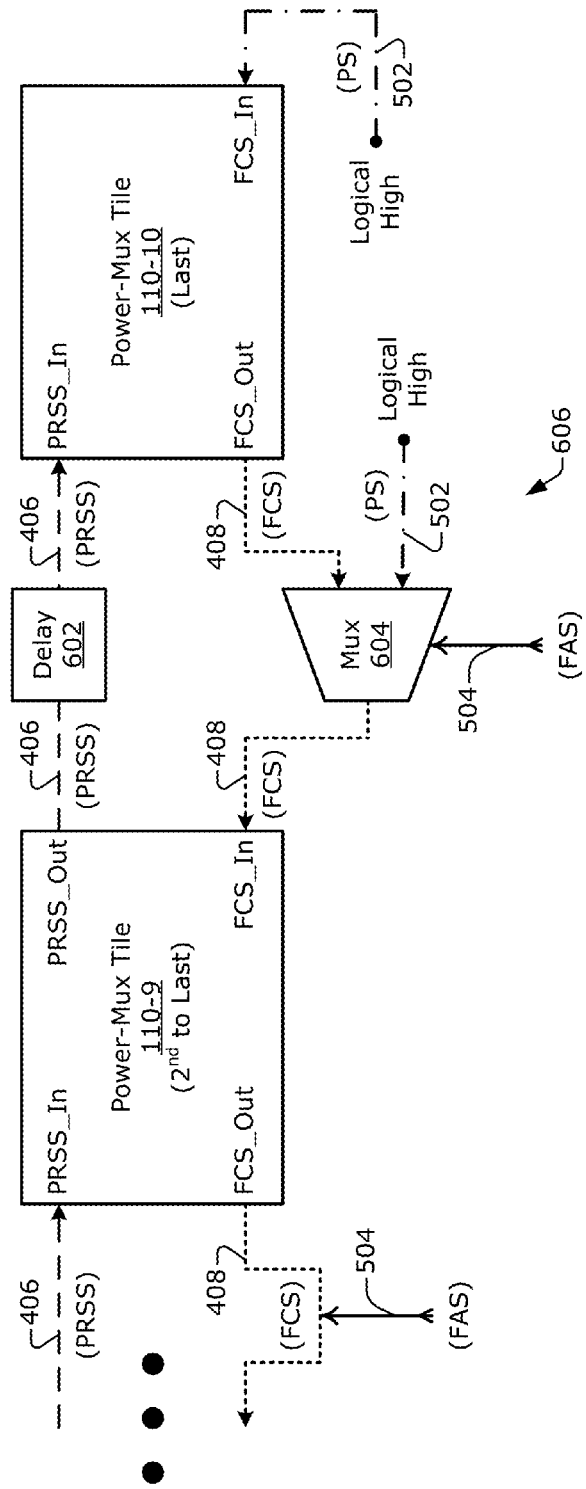
FIG. 6 illustrates an example approach to implementing an adjustment operation responsive to the feedback adjustment signal.

FIG. 6 illustrates an example approach 600 to implementing an adjustment operation 606 responsive to the feedback adjustment signal 504 (FAS). Of the ten power-mux tiles depicted in FIG. 1, two power-mux tiles 110-9 and 110-10 are explicitly shown. FIG. 6 also shows a delay device 602, the power rail selection signal 406 (PRSS), the feedback control signal 408 (FCS), and the preset signal 502 (PS), as well as the feedback adjustment signal 504. The approach 600 includes the adjustment operation 606 that utilizes a multiplexer 604. In an example implementation, the operation 606 provides means for selecting a particular power-mux tile 110 of the multiple power-mux tiles 110-1 to 110-10 for switching out of a sequential order.

The second-to-last power-mux tile 110-9 and the last power-mux tile 110-10 are shown with multiple inputs and outputs. Each power-mux tile 110 generally includes with respect to the power rail selection signal 406 an input (PRSS_In) and an output (PRSS_Out). However, at least one power-mux tile 110, such as the last power-mux tile 110-10, may omit at least the power rail selection signal output (PRSS_Out). Each power-mux tile 110 further generally includes with respect to the feedback control signal 408 an input (FCS_In) and an output (FCS_Out). However, at least one power-mux tile 110, such as the initial power-mux tile 110-1 of FIGS. 1 and 4, may omit at least the feedback control signal output (FCS_Out). Furthermore, at least one power-mux tile 110, such as the last power-mux tile 110-10, may omit at least the feedback control signal input (FCS_In) by relying on an internal delay control circuit 410 (not explicitly shown) of the last power-mux tile 110-10 to enable a connection portion of a power-multiplexing operation to proceed independently of a feedback control signal.

A given power-mux tile 110 receives the power rail selection signal 406 at the power rail selection signal input (PRSS_In) thereof from a preceding power-mux tile. After the first switch 212 of the given power-mux tile 110 is opened, the given power-mux tile 110 forwards the power rail selection signal 406 to the next power-mux tile in the series via the power rail selection signal output (PRSS_Out) of the given power-mux tile 110. At least one delay device 602 may be located between consecutive power-mux tiles 110 to delay propagation of the power rail selection signal 406. As shown, the power rail selection signal 406 may be delayed during propagation between a power rail selection signal output (PRSS_Out) of the second-to-last power-mux tile 110-9 and a power rail selection signal input (PRSS_In) of the consecutive and last power-mux tile 110-10.

A given power-mux tile 110 receives the feedback control signal 408 at the feedback control signal input (FCS_In) thereof. If the feedback control signal 408 is asserted, then the second switch 214 of the given power-mux tile 110 is closed, if the first switch 212 thereof is already open. For the last power-mux tile 110-10, the feedback control signal input (FCS_In) may be constantly asserted, such as by being provided the preset signal 502 in a logical high state.

The feedback control signal output (FCS_Out) of a given power-mux tile 110 is not asserted, e.g. is set to a logical low value, if the first switch 212 thereof is still closed or if the second switch 214 thereof is not yet closed. After the first switch 212 is opened and the second switch 214 is closed for the given power-mux tile 110-10, then the feedback control signal output (FCS_Out) thereof is changed to a logical high. If each feedback control signal output (FCS_Out) of one power-mux tile is directly connected to each feedback control signal input (FCS_In) of another, succeeding power-mux tile, then the resulting power-multiplexing operation, including the connection portion thereof, may unfold fully sequentially.

An out-of-sequential ordering, on the other hand, is enabled by the feedback adjustment signal 504. The multiplexer 604 receives two inputs: the feedback control signal 408 output from a preceding power-mux tile and the preset signal 502, which is tied to a logical high value. The multiplexer 604 produces an output: the feedback control signal 408 for the input of the succeeding power-mux tile 110. The input selection of the multiplexer 604 is controlled by the feedback adjustment signal 504, which is coupled to a control input of the multiplexer 604. In an example implementation, the multiplexer 604 provides means for forwarding a preset signal 502 that is set to a logical high value, instead of an output feedback control signal 408 produced by a preceding power-mux tile (e.g., the last power-mux tile 110-10), to the particular power-mux tile (e.g., the second-to-last power-mux tile 110-9) to select the particular power-mux tile for power rail multiplexing out of a sequential order.

More specifically, the feedback adjustment signal 504 selects between the signal provided by the feedback control signal output (FCS_Out) of the preceding power-mux tile 110-10 and the logical high preset signal 502 using the multiplexer 604. The feedback adjustment signal 504 serves to select for coupling one signal or the other to the feedback control signal input (FCS_In) of the succeeding power-mux tile 110-9. If the feedback adjustment signal 504 selects the logical high preset signal 502, then the succeeding power-mux tile 110-9 is enabled to close the second switch 214 thereof at a timing that is out of the fully sequential order. Examples of the connection switching occurring in a non-sequential order are illustrated in FIG. 3 at the arrows 306. Using the feedback adjustment signal 504, the adjustment circuitry 208 can dynamically, selectively, and independently control a timing of an occurrence of an individual power-multiplexing operation for one or more individual tiles of multiple power-mux tiles of a chained series of power-mux tiles.

In certain embodiments, the adjustment circuitry 208 (e.g., of FIG. 5) can be implemented to adjust an order in which the multiple power-mux tiles 110-1 to 110-10 perform at least a portion of a power-multiplexing operation 300 in a static manner or in a dynamic manner. The operational order may be adjusted out of an order that is determined by the series coupling of the chained arrangement of the multiple power-mux tiles 110-1 to 110-10. In an example dynamic manner, the adjustment circuitry 208 can provide a different value for the feedback adjustment signal 504 to select an input of the multiplexer 604 for forwarding to the feedback control signal input of the next succeeding power-mux tile. In an example static manner, the adjustment circuitry 208 can provide, as part of a feedback control signal propagation, a signal having a fixed value, such as by being tied to a preset signal having logical high value or a logical low value. A feedback adjustment signal 504 of a particular power-mux tile 110, for instance, can be tied to a preset value. A constant value of the feedback adjustment signal 504 can ensure that a desired one of the preset signal 502 or the feedback control signal 408 output from a preceding power-mux tile 110 is the signal that is forwarded to the feedback control signal input of the succeeding power-mux tile 110. Alternatively, a feedback control signal 408 that is coupled to a feedback control signal input of a particular power-mux tile 110 can be directly tied to a preset signal having a constant logical high or low value, thus bypassing or obviating the multiplexer 604. In a dynamic manner or a static manner, adjusting an order in which the multiple power-mux tiles 110-1 to 110-10 perform at least a portion of a power-multiplexing operation 300 can establish a duration of a short-circuit current condition, as is described below with reference to FIGS. 7-10.

FIGS. 7-10 illustrate different example orders for a power-multiplexing operation to be performed by multiple power-mux tiles 110. A chained series of ten power-mux tiles 110-1 to 110-10 are shown, including the initial power-mux tile 110-1 and the last power-mux tile 110-10 at the terminating end of the chained series. The adjustment circuitry 208 of FIG. 5 propagates the power rail selection signal 406 left-to-right in a serial order from the initial power-mux tile 110-1 to the last power-mux tile 110-10. The adjustment circuitry 208 propagates the feedback control signal 408 right-to-left from the last power-mux tile 110-10 to the initial power-mux tile 110-1. A respective power-mux tile 110 can be caused to close a respective second switch 214 out of order by controlling a value of the feedback control signal 408.

The adjustment circuitry 208 controls the feedback control signal 408 that is input to a succeeding power-mux tile with the feedback adjustment signal 504. If the feedback adjustment signal 504 at a logical low value, as represented by a "0," is applied to the feedback control signal 408 via the multiplexer 604 of FIG. 6, the succeeding power-mux tile 110 waits to perform a connection portion of the power-multiplexing operation until the preceding power-mux tile 110 performs the connection portion. On the other hand, if a logical high, as represented by a "1," is applied by the feedback adjustment signal 504, the succeeding power-mux tile 110 is enabled to perform a connection portion of the power-multiplexing operation without waiting on a preceding power-mux tile 110.

FIGS. 7-10 illustrate at least one disconnection order and at least one connection order. Each figure includes an arrow 702 that indicates a disconnection order for opening first switches 212 as part of the disconnection portion 308 of the power-multiplexing operation 300 of FIG. 3. Each also includes at least one arrow 704 that indicates a connection order for closing second switches 214 as part of the connection portion 310 of the power-multiplexing operation 300. The arrows 704 correspond to a feedback direction of the power-multiplexing operation 300. Each figure further includes at least one arrow 706 indicative of an individual power-multiplexing operation within an individual power-mux tile 110, which is analogous to the operations occurring as indicated by the delay signal 412 of FIG. 4. For the arrows 706, a particular power-mux tile 110 is enabled to close a second switch 214 and couple the load power rail 106 to the second power rail 104 regardless of a status of a second switch 214 of a preceding power-mux tile, if any, with respect to a feedback or connection direction proceeding from right-to-left as shown. FIGS. 7-10 also indicate the duration 312 for a short-circuit current condition between two or more power-mux tiles.

FIGS. 7-10 also serve to illustrate the existence of a physical distance between different power-mux tiles on an integrated circuit. The physical distance results from distributing the power-mux tiles around an integrated circuit to accommodate a circuit load that is distributed over some area of the integrated circuit. The intrinsic capacitance of the circuit load filters or retards development of an actual short-circuit current because any short-circuit current would flow across the physical distance spanned between or among multiple power-mux tiles, along with the intrinsic capacitance associated with this physical distance.

Figure 7:
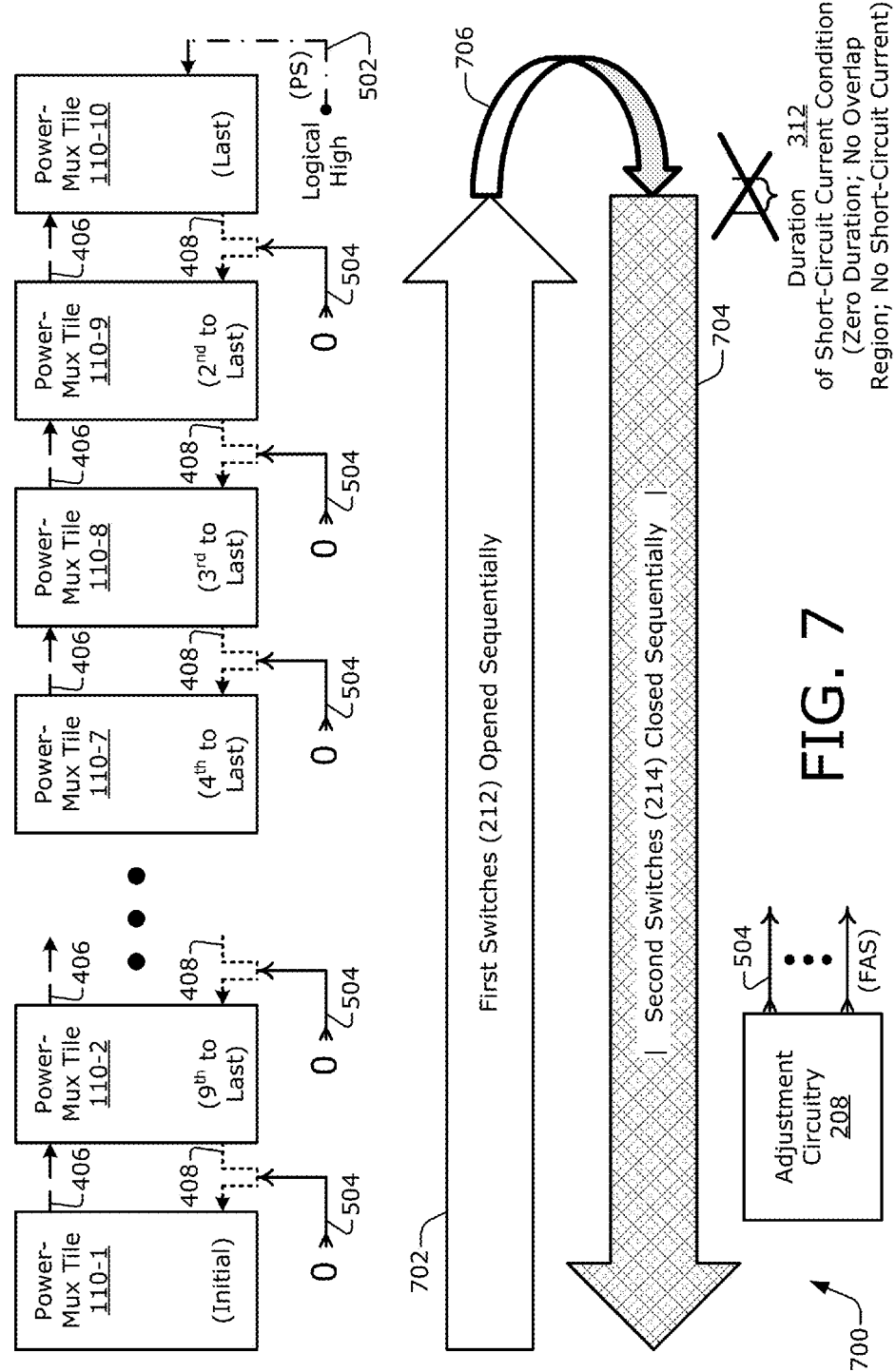
FIG. 7 illustrates an example order for a power-multiplexing operation to be performed by multiple power-mux tiles in which no short-circuit current condition is created.

FIG. 7 illustrates an example order 700 for a power-multiplexing operation to be performed by multiple power-mux tiles 110-1 to 110-10 in which no short-circuit current condition is created. Each instance of the feedback adjustment signal 504 has a logical low value across the series of power-mux tiles, so each instance of the multiplexer 604 selects the outgoing feedback control signal 408 from a previous power-mux tile to forward as the incoming feedback control signal 408 for a succeeding power-mux tile. Consequently, both the disconnection portion and the connection portion of the power-multiplexing operation are performed sequentially.

As indicated by the arrow 702, each of the first switches is opened sequentially; hence, the arrow 702 represents a sequential disconnection order along a disconnection direction. For the order 700, the sequential disconnection is performed as follows: 110-1, 110-2, 110-3, 110-4, 110-5, 110-6, 110-7, 110-8, 110-9, to 110-10. As indicated by the single arrow 704, each of the second switches is closed sequentially; hence, the single arrow 704 represents a sequential connection order along a connection or feedback direction. For the order 700, the sequential connection is performed as follows: 110-10, 110-9, 110-8, 110-7, 110-6, 110-5, 110-4, 110-3, 110-2, to 110-1. There is no overlap region in which switches for both power supplies are simultaneously closed, even in different power-mux tiles. There is therefore a duration 312 of zero for the short-circuit current condition.

Figure 8:
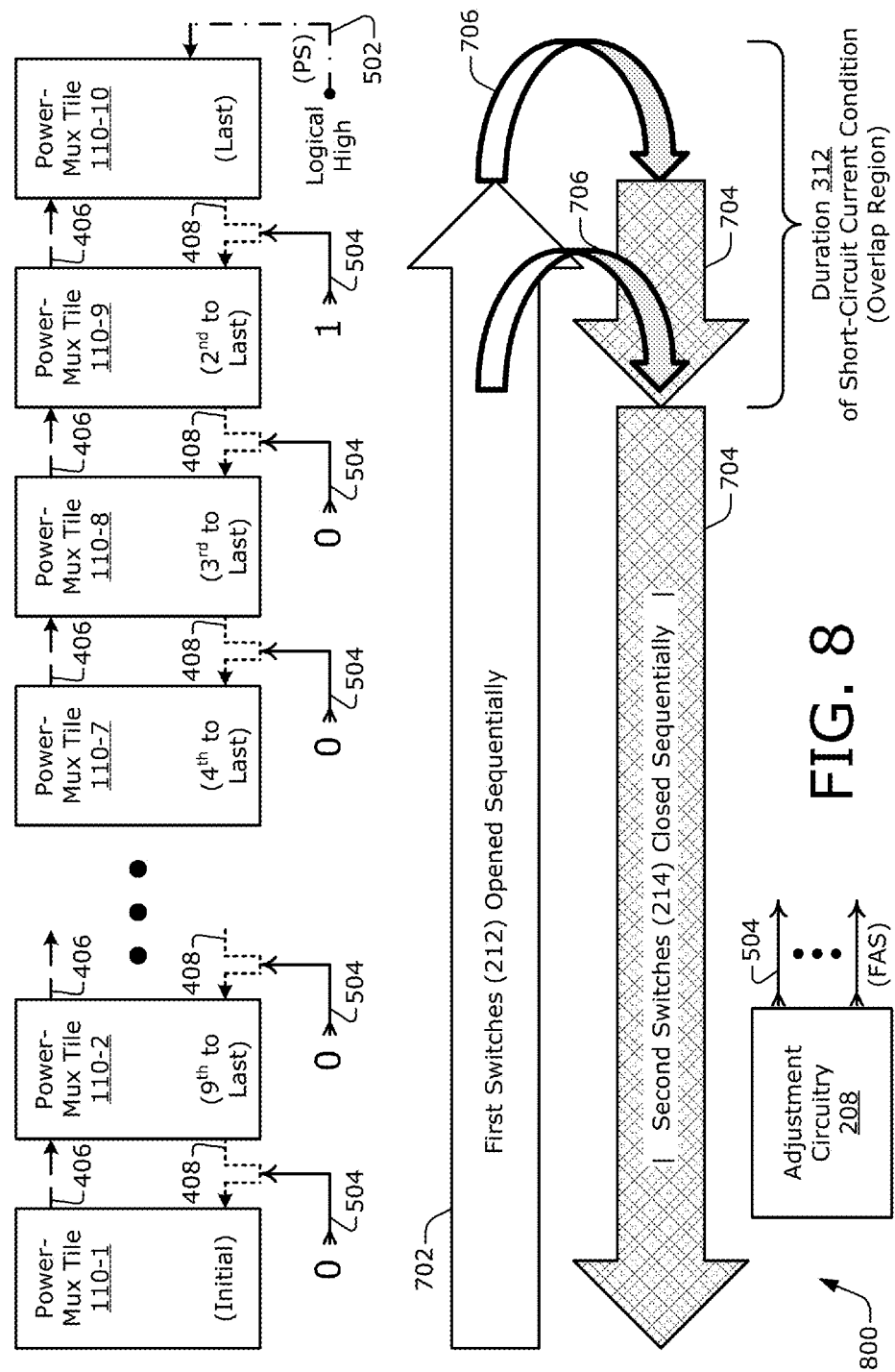
FIG. 8 illustrates an example order for a power-multiplexing operation to be performed by multiple power-mux tiles in which a short-circuit current condition is created for one duration.

FIG. 8 illustrates an example order 800 for a power-multiplexing operation to be performed by multiple power-mux tiles 110-1 to 110-10 in which a short-circuit current condition is created for a duration 312. Each instance of the feedback adjustment signal 504 has a logical low value across the series of power-mux tiles except for the instance of the feedback adjustment signal 504 that is applied to the second-to-last power-mux tile 110-9. Accordingly, the second-to-last power-mux tile 110-9 is enabled to close the second switch 214 thereof after the first switch 212 thereof is opened, regardless of the state of the feedback control signal 408 that is output from the preceding, and in this example last, power-mux tile 110-10.

Consequently, although the disconnection portion is performed sequentially, the connection portion is not performed fully sequentially. For the order 800, the sequential disconnection is performed like the order 700 of FIG. 7 as follows: 110-1, 110-2, 110-3, 110-4, 110-5, 110-6, 110-7, 110-8, 110-9, to 110-10. For the order 800, at least the connection portion at the second-to-last power-mux tile 110-9 is performed out of the sequential order. As indicated by the presence of two arrows 704, one power-mux tile 110 couples the second power rail 104 to the load power rail 106 out of the serial order. For the order 800, the non-sequential connection may be performed as follows: 110-9, 110-10, 110-8, 110-7, 110-6, 110-5, 110-4, 110-3, 110-2, to 110-1. Alternatively, for the order 800, the non-sequential connection may be performed as follows: 110-9, 110-8, 110-10, 110-7, 110-6, 110-5, 110-4, 110-3, 110-2, to 110-1. Whether power-mux tile 110-8 or power-mux tile 110-10 closes a respective second switch 214 second in the non-sequential connection order depends on a delay time of the delay control circuit 410 (not explicitly shown) of the last power-mux tile 110-10, which is also represented by the delay signal 412 of FIG. 4. The multiple arrows 704 therefore represent a non-sequential connection order with respect to the entire chained series of power-mux tiles. The duration 312 of a short-circuit current condition is indicated for an overlap region in which at least one first switch 212 (e.g., of the last power-mux tile 110-10) and at least one second switch 214 (e.g., of the second-to-last power-mux tile 110-9) of different power-mux tiles are both closed for part of the overlap region.

Figure 9:
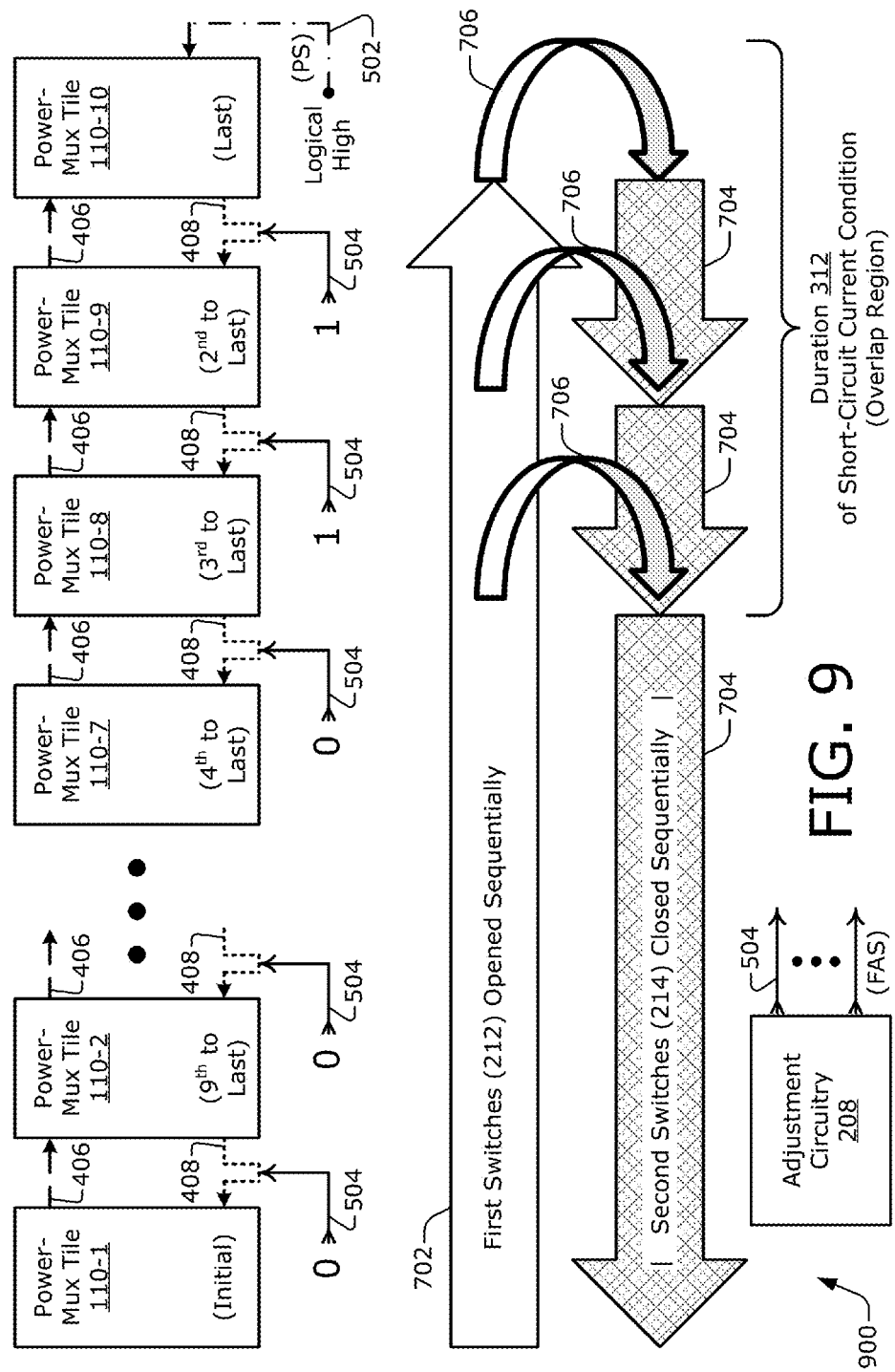
FIG. 9 illustrates another example order for a power-multiplexing operation to be performed by multiple power-mux tiles in which a short-circuit current condition is created for another, longer duration.

FIG. 9 illustrates another example order 900 for a power-multiplexing operation to be performed by multiple power-mux tiles 110-1 to 110-10 in which a short-circuit current condition is created for another, longer duration 312. Each instance of the feedback adjustment signal 504 has a logical low value across the series of power-mux tiles except for the instances of the feedback adjustment signal 504 that are applied to the second-to-last power-mux tile 110-9 and the third-to-last power-mux tile 110-8. Accordingly, the second-to-last power-mux tile 110-9 is enabled to close the second switch 214 thereof after the first switch 212 thereof is opened, regardless of the state of the feedback control signal 408 that is output from the preceding, and last, power-mux tile 110-10. Similarly, the third-to-last power-mux tile 110-8 is enabled to close the second switch 214 thereof after the first switch 212 thereof is opened, regardless of the state of the feedback control signal 408 that is output from the preceding, and second-to-last, power-mux tile 110-9.

Consequently, although the disconnection portion is performed sequentially, the connection portion is not performed fully sequentially. Specifically, at least the connection portion at the second-to-last power-mux tile 110-9 and at the third-to-last power-mux tile 110-8 is performed out of the sequential order as indicated by the arrows 706. For the order 900, the non-sequential connection is started at the power-mux tile 110-8. The next power-mux tile to close a respective second switch 214 may be the power-mux tile 110-7 or the power-mux tile 110-9, depending on propagation delays and a given implementation. And as indicated by the presence of three arrows 704, two power-mux tiles couple the second power rail 104 to the load power rail 106 out of the serial order. The multiple arrows 704 therefore represent a non-sequential connection order with respect to the entire chained series of power-mux tiles. The duration 312 of a short-circuit current condition is indicated for an overlap region in which at least two first switches 212 (e.g., of the second-to-last power-mux tile 110-9 and the last power-mux tile 110-10) and at least two second switches 214 (e.g., of the third-to-last power-mux tile 110-8 and the second-to-last power-mux tile 110-9) are both closed for part of the overlap region.

In these manners, the adjustment circuitry 208 can selectively enable one or more particular power-mux tiles of the series of power-mux tiles 110-1 to 110-10 to proceed with at least a connection portion of a power-multiplexing operation. Consequently, the adjustment circuitry 208 can adjust at least one order in which the multiple power-mux tiles 110-1 to 110-10 perform at least a portion of the power-multiplexing operation. In an example implementation, the adjustment circuitry 208 further provides means for establishing a duration 312 that a short-circuit current condition exists between the first power rail 102 and the second power rail 104 across different power-mux tiles during the power-multiplexing operation 300.

The adjustment circuitry 208 can further adjust a length of the duration 312 of the short-circuit current condition. The length is controllable, for example, based on a number of intervening power-mux tiles between one power-mux tile that is last in the serial order of the multiple power-mux tiles and another power-mux tile that is first to be enabled to couple the load power rail to the second power rail out of the at least one sequential order. Accordingly, for FIG. 8, the second-to-last power-mux tile 110-9 is the first to be enabled, and there are zero intervening power-mux tiles between the second-to-last power-mux tile 110-9 and the last power-mux tile 110-10. For FIG. 9, the third-to-last power-mux tile 110-8 is the first to be enabled, and there is one intervening power-mux tile between the third-to-last power-mux tile 110-8 and the last power-mux tile 110-10. The duration 312 of FIG. 9 is therefore longer than the duration 312 of FIG. 8.

Figure 10:
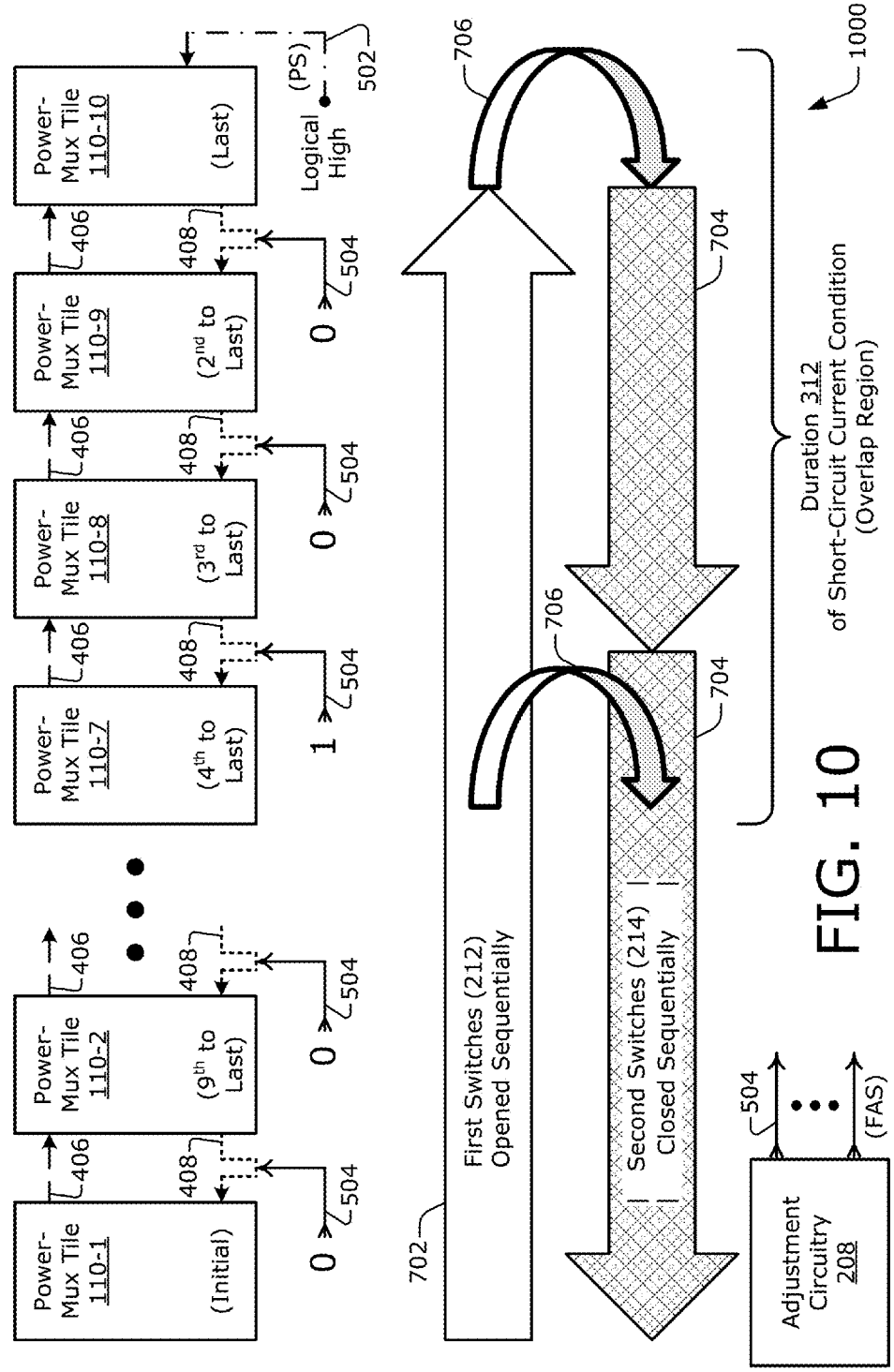
FIG. 10 illustrates an example approach to selectively cause an individual power-mux tile to perform at least a portion of a power-multiplexing operation out of a sequential order.
Figure 11:
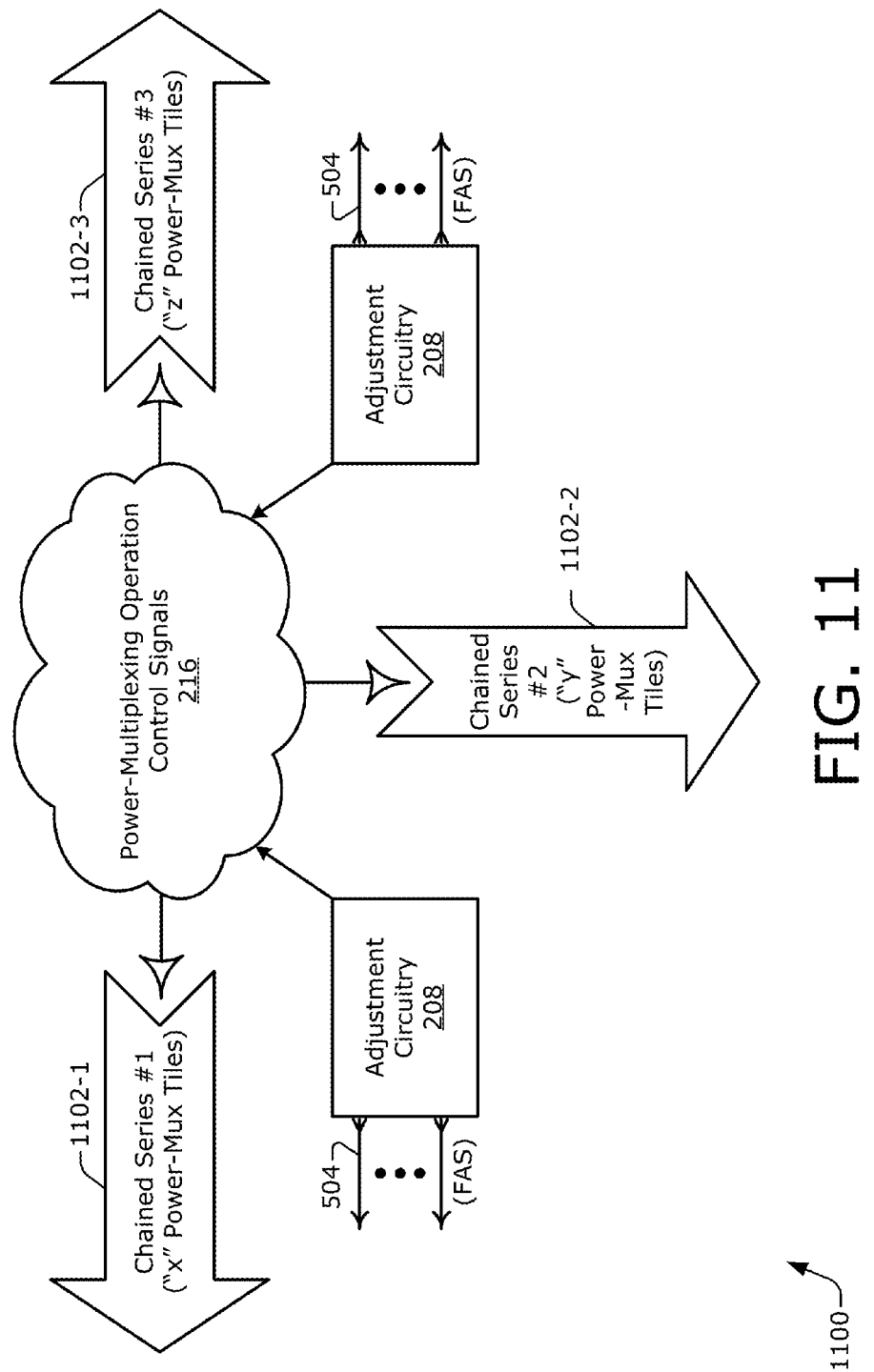
FIG. 11 depicts an example mechanism in which multiple chained series of power-mux tiles are managed by adjustment circuitry.

FIGS. 10 and 11 show additional or alternative implementations, including how physical distance between different power-mux tiles can affect the development of short-circuit current while helping to provide power to different areas of a circuit load during a power multiplexing operation. FIG. 10 illustrates how an individual power-mux tile 110 of a chained series of power-mux tiles can be independently enabled to perform at least part of a power-multiplexing operation out of a sequential order. FIG. 11 illustrates how multiple chained series of power-mux tiles can be jointly controlled to establish a short-circuit current condition of a desired duration across the different chained series.

FIG. 10 illustrates an example approach 1000 to selectively cause an individual power-mux tile to perform at least a portion of a power-multiplexing operation out of a sequential order. In contrast with the example approaches described above with reference to FIGS. 7-9, a power-mux tile 110 is enabled for out-of-order power multiplexing, but the second-to-last power-mux tile 110-9 is not selected. Any one or more particular power-mux tiles 110 may be individually enabled. In an example implementation, the adjustment circuitry 208 further provides means for enabling a particular power-mux tile 110 of the multiple power-mux tiles 110-1 to 110-10 to perform at least part of the power multiplexing operation 300 out of the at least one order. With the approach 1000, the instance of the feedback adjustment signal 504 that is associated with and applied to the fourth-to-last power-mux tile 110-7 is asserted by the adjustment circuitry 208. Accordingly, the fourth-to-last power-mux tile 110-7 is selected and enabled to couple the second power rail 104 to the load power rail 106 out of the serial order. The third-to-last power-mux tile 110-8 and the second-to-last power-mux tile 110-9, however, are not so enabled.

Consequently, although the disconnection portion is performed sequentially, the connection portion is not performed fully sequentially. For the order of FIG. 10, the sequential disconnection is performed like the orders described above as follows: 110-1, 110-2, 110-3, 110-4, 110-5, 110-6, 110-7, 110-8, 110-9, to 110-10. On the other hand, at least the connection at the fourth-to-last power-mux tile 110-7 is performed out of the sequential order. Specifically, the non-sequential connection is started at the power-mux tile 110-7. The next power-mux tile to close a respective second switch 214 depends on propagation delays or internal circuitry delays of a given implementation. For one example order, the non-sequential connection may occur as follows: 110-7, 110-6, 110-5, 110-10, 110-4, 110-9, 110-3, 110-8, 110-2, to 110-1. However, the last power-mux tile 110-10 may connect a supply power rail to the load power rail, and thus start the connections represented by the arrow 704 on the right of FIG. 10, sooner or later than after the power-mux tile 110-5.

As indicated by the presence of two arrows 704, one power-mux tile couples the second power rail 104 to the load power rail 106 out of the serial order. The multiple arrows 704 therefore represent a non-sequential connection order with respect to the entire chained series of power-mux tiles. The duration 312 of a short-circuit current condition is indicated for an overlap region in which multiple first switches 212 and at least one second switch 214 are closed for part of the overlap region. Accordingly, for FIG. 10, the fourth-to-last power-mux tile 110-7 is the first to be enabled, and there are two intervening power-mux tiles between the fourth-to-last power-mux tile 110-7 and the last power-mux tile 110-10, which at least partially determines a length of the duration 312.

Examples for the duration 312 are discussed in terms of separation distances between different power-mux tiles. Between the power-mux tile 110-7 and the power-mux tile 110-8, there is one power-mux tile of separation distance. However, there is also additional overlap time due to a delay for the propagation of the power rail selection signal 406 between the two tiles because a first switch of the power-mux tile 110-8 is subsequently opened. Between the power-mux tile 110-7 and the power-mux tile 110-9, there are two power-mux tiles of separation distance, but the overlap time for the propagation of the power rail selection signal 406 is for three power-mux tiles. Between the power-mux tile 110-7 and the power-mux tile 110-10, there are three power-mux tiles of separation distance, but the overlap time for the propagation of the power rail selection signal 406 is for four power-mux tiles. Because of the physical distance between the power-mux tiles creating the short-circuit current condition, the load circuitry and the intrinsic capacitance thereof filters the potential short-circuit current. If the intrinsic capacitance is sufficiently large, there may be no actual, or at least no consequential, short-circuit current between two different power rails during the short-circuit current condition.

In FIG. 10, one power-mux tile, specifically power-mux tile 110-7, is configured to close a second switch out of the sequential order. However, two or more power-mux tiles may alternatively be so configured. For example, the power-mux tile 110-2 and the power-mux tile 110-8 may be fed a logical high value for respective ones of the associated feedback adjustment signal 504. In this example, there is a physical distance between the two power-mux tiles switching out-of-order. This physical distance reduces a level of any short-circuit current and provides power proximately to different portions of a circuit load during a power-multiplexing operation. Enabling the switching out-of-a-sequential order can also reduce an absolute amount of time during which both switches of a given power-mux tile are open, and therefore not supplying power to underlying load circuitry in the vicinity of the given power-mux tile. For example, in a fully sequential closing-opening scenario, the power-mux tile 110-1 has 20 delay phases to proceed through the entire daisy-chained arrangement (e.g., 10 forward and 10 backward phases). But if the power-mux tile 110-2 is fed a logical 1 via the associated feedback adjustment signal 504, the power-mux tile 110-1 has just four delay phases.

FIG. 11 depicts an example mechanism 1100 in which multiple chained series of power-mux tiles are managed by adjustment circuitry. As shown, the mechanism 1100 includes the adjustment circuitry 208, the power-multiplexing operation control signals 216, and multiple chained series 1102-1 to 1102-3. Specifically, three chained series are shown: a first chained series 1102-1, a second chained series 1102-2, and a third chained series 1102-3. Each chained series 1102 includes multiple power-mux tiles, which are not separately shown in FIG. 11, that are daisy-chained together in series. Examples of a chained series 1102 include those illustrated in FIGS. 2-10. The first, second, and third chained series 1102-1, 1102-2, and 1102-3 respectively include "x," "y," and "z" numbers of power-mux tiles, in which "x," "y," and "z" may be whole numbers that are different from each other or the same.

The adjustment circuitry 208 can generate the power-multiplexing operation control signals 216 to jointly control the multiple chained series 1102-1 to 1102-3 of power-mux tiles. Using the power-multiplexing operation control signals 216, the adjustment circuitry 208 can configure different short-circuit current conditions between or among the different ones of the multiple chained series 1102-1 to 1102-3. The creation of a short-circuit current condition can be adjusted based on any one or more of a number of different factors. Factors include, for example, whether or not the power-mux tile numbers "x," "y," and "z" are the same. If one chained series 1102 is longer than another one, for instance, a short-circuit current can be created without providing different or differently-timed control signals. Another factor pertains to a timing of control signals. For example, control signals may be intentionally skewed temporally, such as by delaying the arrival of the power rail selection signal 406 for one of the chained series. Yet another factor is based on configuring the feedback adjustment signal 504. Power-mux tiles 110 that are positioned differently with regard to a respective last power-mux tile in different chained series 1102 may be selected for out-of-order power rail switching. Furthermore, to achieve a desired duration 312, combinational logic may be disposed between a feedback adjustment signal 504 and different chained series for synchronization purposes.

In an example with two chained series, a first chained series 1102-1 of power-mux tiles includes multiple first power-mux tiles, and a second chained series 1102-1 of power-mux tiles includes multiple second power-mux tiles. The power-mux tiles of the first and second chained series 1102-1 and 1102-2 jointly perform power-multiplexing operations. The adjustment circuitry 208 is implemented to adjust the duration 312 of a short-circuit current condition created between the first power rail 102 and the second power rail 104 by coordinating operation of the first chained series 1102-1 of power-mux tiles and the second chained series 1102-2 of power-mux tiles.

Figure 12:
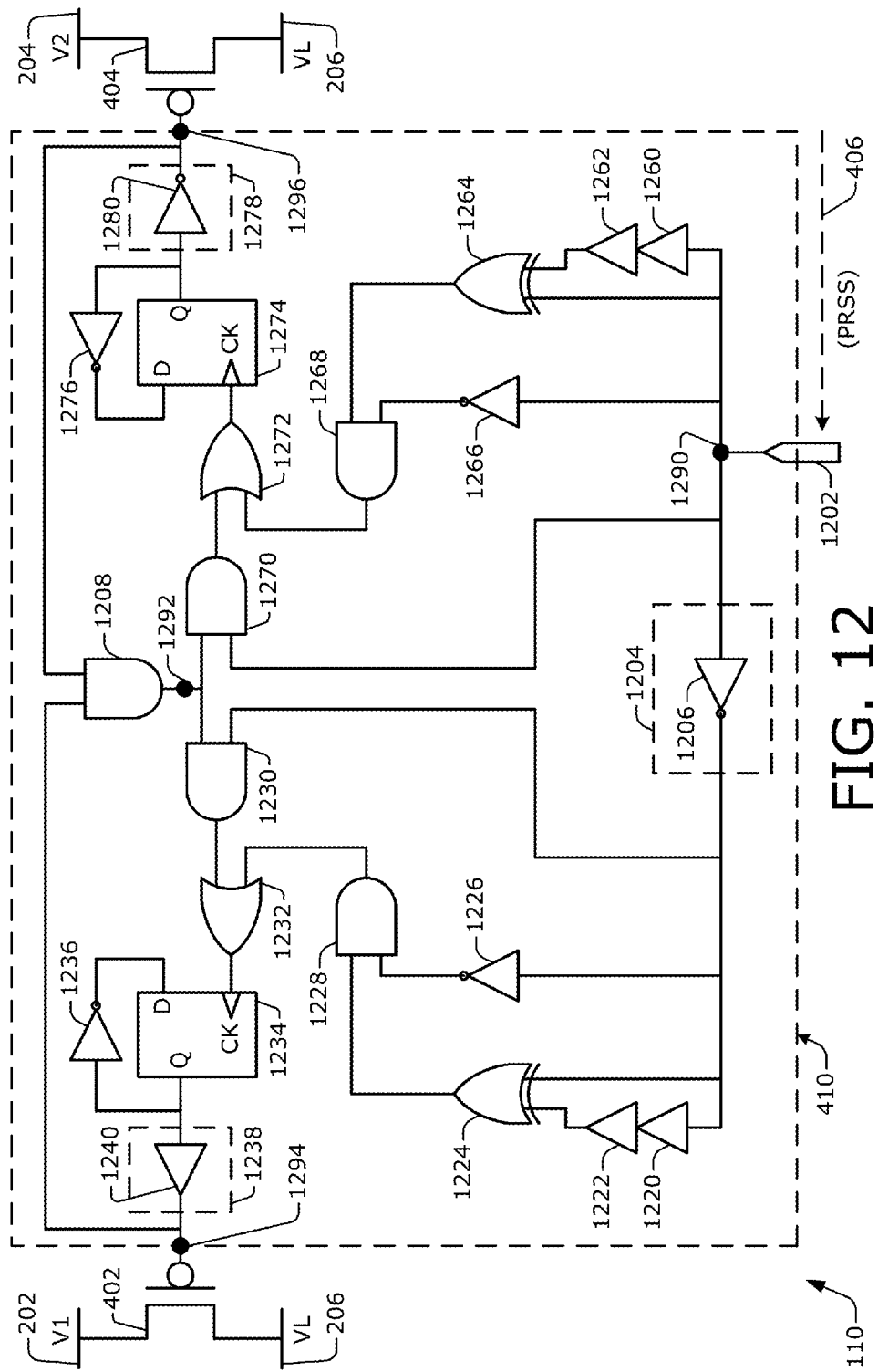
FIG. 12 depicts an example implementation for a power-mux tile that includes two transistors, which are respectively associated with two power rails, and a delay control circuit.
Figure 13:
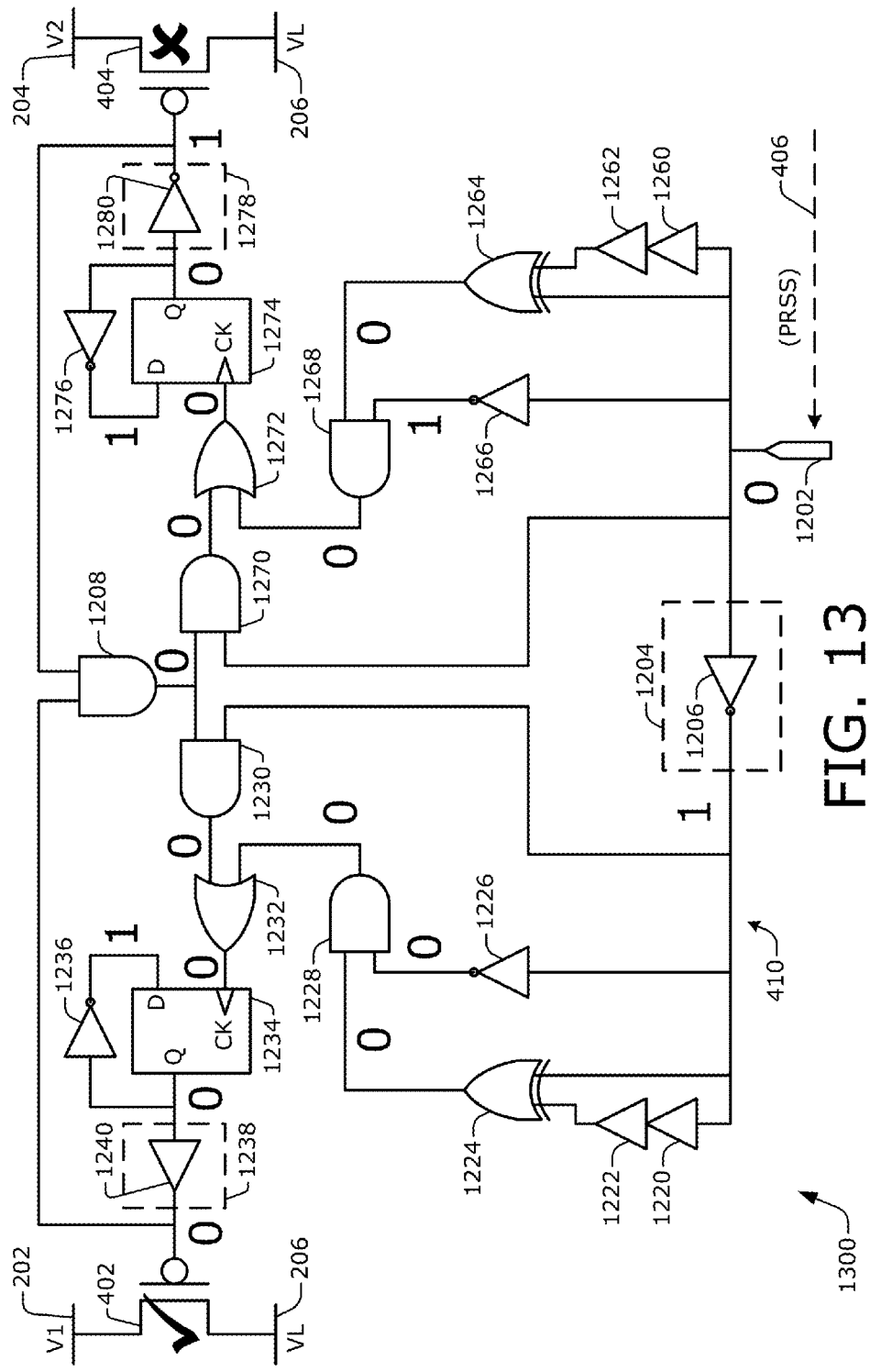
FIG. 13 illustrates an example first operational steady-state condition of the power-mux tile of FIG. 12.
Figure 14:
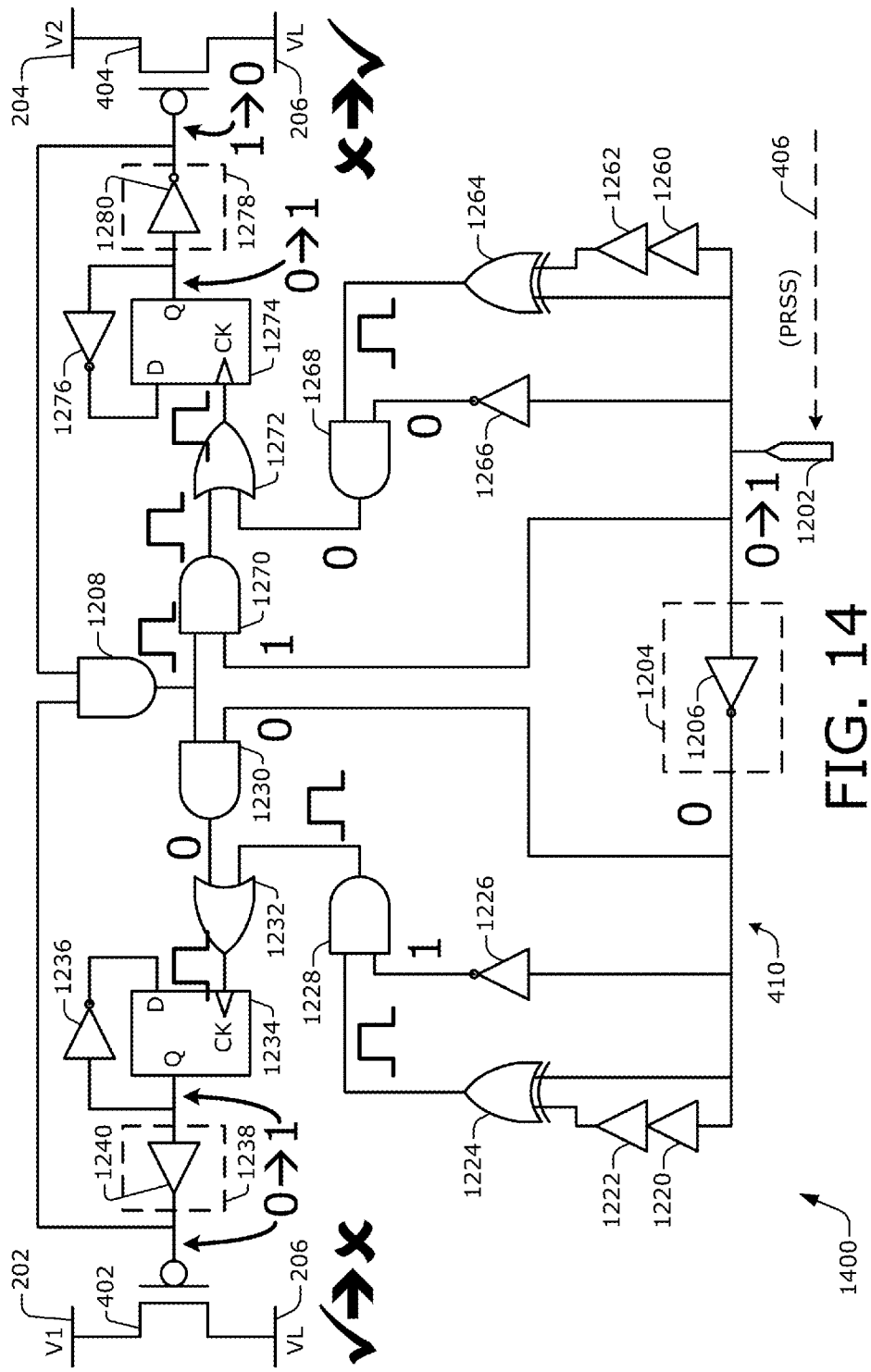
FIG. 14 illustrates an example transitional state of the power-mux tile of FIG. 12.
Figure 15:
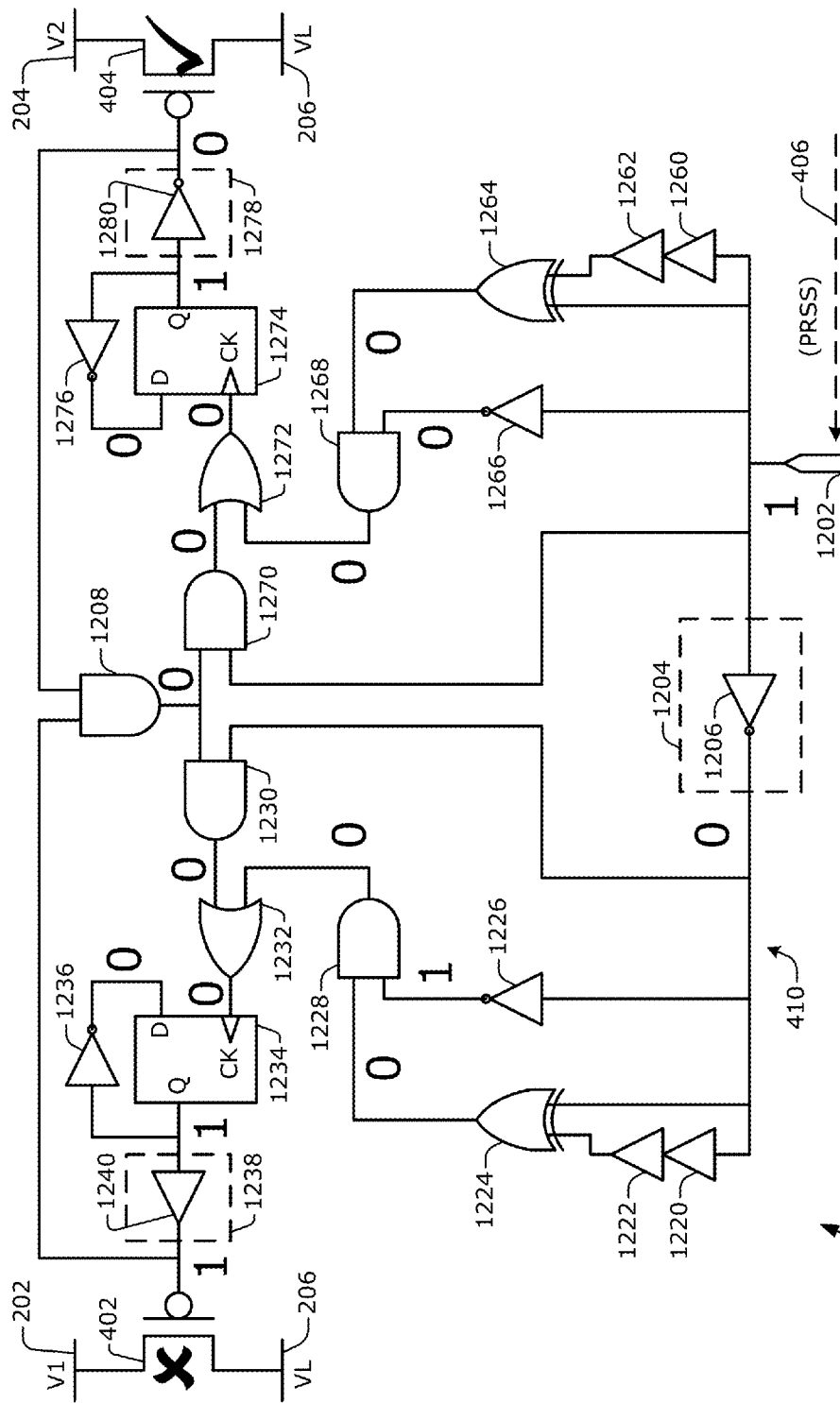
FIG. 15 illustrates an example second operational steady-state condition of the power-mux tile of FIG. 12.
Figure 16:
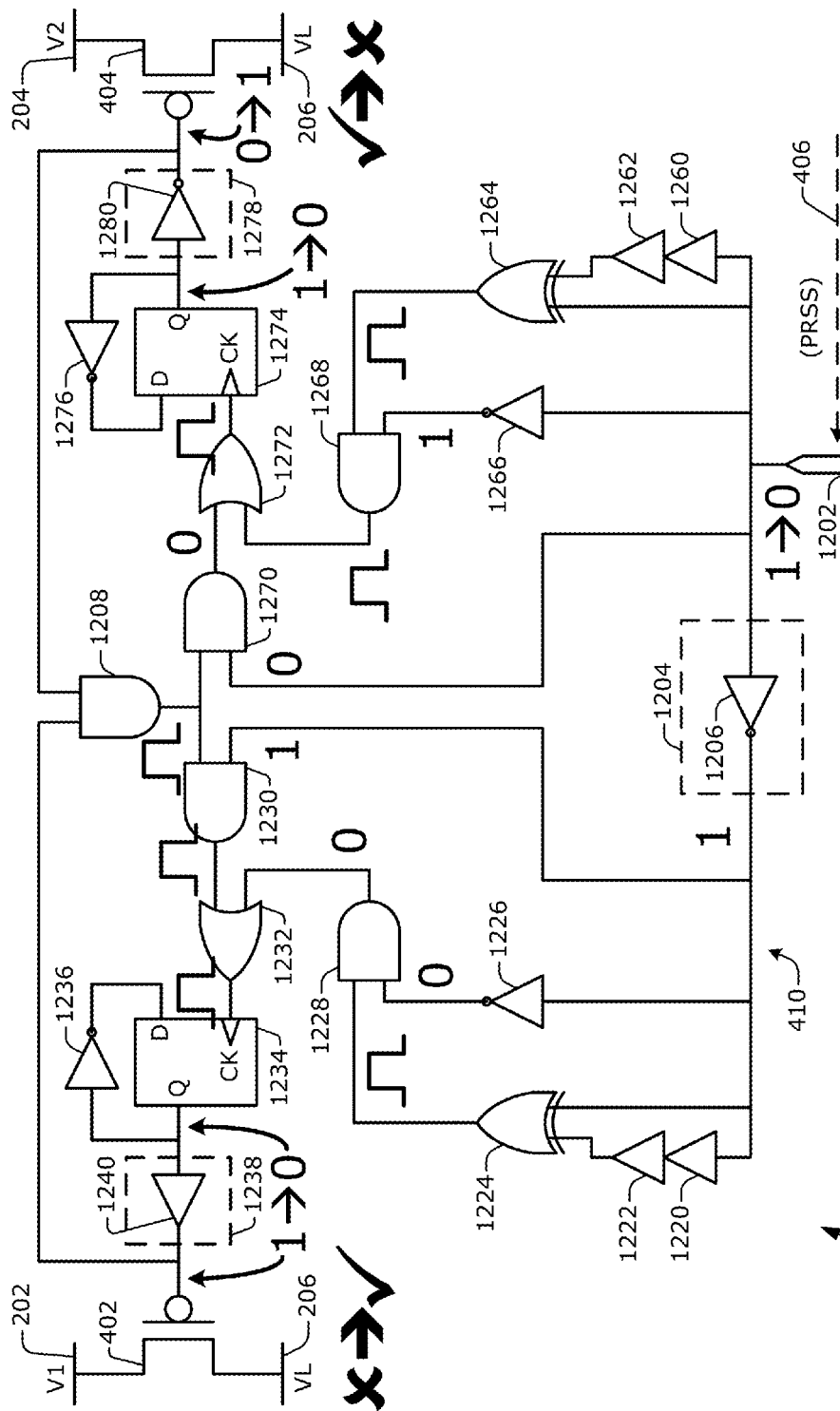
FIG. 16 illustrates another example transitional state of the power-mux tile of FIG. 12.

FIGS. 12-16 show an example power-mux tile 110 including a delay control circuit. FIG. 12 illustrates circuit devices and interconnections thereof for a power-mux tile 110. An example delay control circuit 410 is explicitly indicated in FIG. 12. FIG. 13 shows a first operational steady-state condition of the power-mux tile 110 in which the first transistor 402 is on and the second transistor 404 is off. FIG. 14 shows an example transitional state of the power-mux tile 110 to illustrate a transition from the first operational steady-state condition of FIG. 13 to a second operational steady-state condition of FIG. 15. FIG. 15 shows the second operational steady-state condition of the power-mux tile 110 in which the first transistor 402 is off and the second transistor 404 is on. FIG. 16 shows an example transitional state of the power-mux tile 110 to illustrate a transition from the second operational steady-state condition of FIG. 15 back to the first operational steady-state condition of FIG. 13.

The delay control circuit 410 is an example part of the power-mux circuitry 210 of FIG. 2. As described below, the delay control circuit 410 may comprise self-timed circuitry. For example, the delay control circuit 410 may have an operational timing that is independent of a periodic clock signal. The circuit devices as described below in FIGS. 12-16 operate without using a periodic clock signal for timing purposes. Additionally or alternatively, the delay control circuit 410 may include multiple circuit devices that have a joint operational timing that is based at least partially on an intrinsic speed of individual ones of the multiple circuit devices. A joint operational timing may represent a combined total time for an operation or a time period resulting from operations of the multiple circuit devices that are interrelated. Each of the illustrated or described signal flows of FIGS. 13-16 may individually or in combination represent an example of a delay signal 412 of FIG. 4. Individual transistor operational states are indicated graphically using a "check mark" icon or an "X mark" icon in FIGS. 13-16. A "check mark" indicates that a transistor is "ON," and an "X mark" indicates that a transistor is "OFF."

FIG. 12 depicts an example power-mux tile 110 that includes two transistors 402 and 404 and the delay control circuit 410. More specifically, the power-mux tile 110 includes the first transistor 402, the second transistor 404, and the delay control circuit 410. The first transistor 402 is coupled between the first voltage 202 and the load voltage 206. The second transistor 404 is coupled between a second voltage 204 and the load voltage 206. The first voltage 202, the second voltage 204, and the load voltage 206 correspond respectively to the first power rail 102, the second power rail 104, and the load power rail 106, each of FIG. 4. The delay control circuit 410 enables power switching for the load power rail 106 from the first power rail 102 to the second power rail 104 independently of a voltage level differential between the first voltage 202 and the second voltage 204.

As illustrated, the delay control circuit 410 includes a power rail selection decoder 1204, a flip-flop 1234, a configurable delay device 1238, a flip-flop 1274, a configurable delay device 1278, a node 1290, a node 1292, a node 1294, a node 1296, and multiple other circuit devices that are described below. The node 1290, the node 1292, the node 1294, and the node 1296 are separately identified to facilitate an explanation below of FIG. 17, which includes additional circuit devices for the adjustment circuitry 208. A voltage at the node 1294 controls whether the first transistor 402 is on or off, and a voltage at the node 1296 controls whether the second transistor 404 is on or off.

The flip-flop 1234 or the flip-flop 1274 may comprise, for example, D-type flip-flops having a clocking or triggering input, a data input "D", and a data output "Q." The configurable delay device 1238 or the configurable delay device 1278 may have a separately adjustable operational period that enables a delay time to be increased or decreased. The power rail selection decoder 1204 is capable of decoding a power rail selection signal 406 (PRSS) that is indicative of a selected power source for the load power rail 106 of FIG. 4.

In one or more embodiments, an input node 1202 is applied at the node 1290. The node 1290 is coupled to an input of the power rail selection decoder 1204. The power rail selection decoder 1204 may be implemented, for example, as an inverter 1206 if switching is being performed between two power rails. An output of the power rail selection decoder 1204 is coupled to an input of an AND gate 1230, an input to an inverter 1226, an input to an XOR gate 1224, and an input of a buffer 1220. An output of the buffer 1220 is coupled to an input of a buffer 1222, and an output of the buffer 1222 is coupled to another input of the XOR gate 1224. The buffer 1220, the buffer 1222, and the XOR gate 1224 may operate in concert to produce a pulse at an output of the XOR gate 1224 as described herein with particular reference to FIG. 14.

The output of the XOR gate 1224 and an output of the inverter 1226 are coupled to two separate inputs of an AND gate 1228. An output of the AND gate 1228 and an output of the AND gate 1230 are coupled to two separate inputs of an OR gate 1232. An output of the OR gate 1232 is coupled to the clocking input of the flip-flop 1234. The data output of the flip-flop 1234 is coupled to an input of an inverter 1236, and an output of the inverter 1236 is coupled to the data input of the flip-flop 1234 to invert the data output of the flip-flop 1234 each time the clocking input is triggered. The data output of the flip-flop 1234 is also coupled to an input of the configurable delay device 1238. A delay time imposed by the configurable delay device 1238 may be adjustable after fabrication of an integrated circuit to account for differences in process, voltage, or temperature (PVT), or other circuit operational parameters. For example, an operational timing of a delay control circuit 410 may be set to be sufficiently long to ensure that the first transistor 402 is off before the second transistor 404 is turned on across the PVT in which the integrated circuit is designed to operate. The configurable delay device 1238 may be implemented, for example, as a buffer 1240. An output of the configurable delay device 1238 is coupled to the node 1294. The node 1294 is coupled to the gate terminal of the first transistor 402 and to an input of an AND gate 1208.

As shown, the right half of the delay control circuit 410 appears to be a mirror image of the left half except for a few features. For example, the right half processes the power rail selection signal 406 from the node 1290 without modification by the power rail selection decoder 1204. Also, the configurable delay device 1278 is implemented differently as compared to the configurable delay device 1238. Starting at the input node 1202, the node 1290 is coupled to an input of an AND gate 1270, an input of an inverter 1266, an input to an XOR gate 1264, and an input of a buffer 1260. An output of the buffer 1260 is coupled to an input of a buffer 1262, and an output of the buffer 1262 is coupled to another input of the XOR gate 1264. The buffer 1260, the buffer 1262, and the XOR gate 1264 may operate in concert to produce a pulse at an output of the XOR gate 1264.

The output of the XOR gate 1264 and an output of the inverter 1266 are coupled to two separate inputs of an AND gate 1268. An output of the AND gate 1268 and an output of the AND gate 1270 are coupled to two separate inputs of an OR gate 1272. An output of the OR gate 1272 is coupled to the clocking input of the flip-flop 1274. The data output of the flip-flop 1274 is coupled to an input of an inverter 1276, and an output of the inverter 1276 is coupled to the data input of the flip-flop 1274 to invert the data output of the flip-flop 1274 each time the clocking input is triggered. The data output of the flip-flop 1274 is also coupled to an input of the configurable delay device 1278. A delay time imposed by the configurable delay device 1278 may be adjustable after fabrication of an integrated circuit. The configurable delay device 1278 may be implemented as, for example, an inverter 1280 that has an adjustable operational period in addition to being configured to complement an input value at the output thereof. An output of the configurable delay device 1278 is coupled to the node 1296. The node 1296 is coupled to the gate terminal of the second transistor 404 and to another input of the AND gate 1208. An output of the AND gate 1208 is coupled to the node 1292, and the node 1292 is coupled to another input of the AND gate 1230 and to another input of the AND gate 1270.

FIG. 13 illustrates an example first operational steady-state condition 1300 of the power-mux tile 110 of FIG. 12. With the first operational steady-state condition 1300, the first transistor 402 is on as indicated by the "check mark," and the second transistor 404 is off as indicated by the "X mark." The first operational steady-state condition 1300 may represent a condition after a reset, such as if the first voltage 202 is a standard operational voltage level and the second voltage 204 is a retention or reduced voltage level. For this example, a zero "0" represents a logic low and a low voltage, and a one "1" represents a logic high and a high voltage. For PFETs, a zero "0" or low voltage turns a PFET on, and a one "1" or high voltage turns a PFET off.

As illustrated, a zero is present at the input node 1202 of the delay control circuit 410. The zero is inverted to a one by the inverter 1206. The one applied to the two inputs of the XOR gate 1224 and to the input of the inverter 1226 produces a zero at both outputs. These two zeros are input to the AND gate 1228 and produce a zero. Two zeros are input to the OR gate 1232, and a zero results at the output of the OR gate 1232. The zero is applied to the clocking input of the flip-flop 1234, which holds the data output of the flip-flop 1234 at a value of zero. The zero is inverted by the inverter 1236 to produce a one at the data input of the flip-flop 1234 for a next triggering event. The zero at the data output of the flip-flop 1234 is applied to the gate of the first transistor 402 by the buffer 1240 of the configurable delay device 1238. This zero at the output of the buffer 1240 is also applied to an input of the AND gate 1208, which results in a zero at an input of the AND gate 1230 and at the other input of the OR gate 1232.

The zero at the input node 1202 is also processed by the circuit devices on the right half of the delay control circuit 410. A one is produced by the inverter 1266 at an input of the AND gate 1268, but the other input to the AND gate 1268 is zero due to the exclusive-or operation of the XOR gate 1264, so the output of the AND gate 1268 is zero. Zero values are also otherwise present at the inputs and outputs of the circuit devices on the right half of the delay control circuit 410 except at the output side of the flip-flop 1274. The data output of the flip-flop 1274 is zero. However, the configurable delay device 1278 is implemented as the inverter 1280, so the output of the configurable delay device 1278 is a one. This one value is applied to the gate terminal of the second transistor 404 so that the second transistor 404 is in an off state. The one at the output of the configurable delay device 1278 is also applied to the other input of the AND gate 1208.

FIG. 14 illustrates an example transitional state 1400 of the power-mux tile 110 of FIG. 12. As part of the transitional state 1400, the first transistor 402 is transitioning from being on to being off, and the second transistor 404 is transitioning from being off to being on. The power rail selection signal 406 transitions from zero to one at the input node 1202. The inverter 1206 of the power rail selection decoder 1204 decodes the one of the power rail selection signal 406 and produces a zero. The zero is provided to an input of the AND gate 1230 and inverted by the inverter 1226 to provide a one at an input of the AND gate 1228. The zero at the output of the inverter 1206 is provided to the right input of the XOR gate 1224. Because the propagation of this zero is delayed by buffers 1220 and 1222, the left input of the XOR gate 1224 temporarily remains at the one present during the previous steady-state condition of FIG. 13 and prior to the transition of the power rail selection signal 406. During the buffering delay produced by the buffers 1220 and 1222, the XOR gate 1224 produces a value of one, likewise temporarily. The temporary nature of the one value at the output of the XOR gate 1224 results in the creation of a pulse as illustrated. Hence, the buffer 1220, the buffer 1222, and the XOR gate 1224 operate together as a pulse generator responsive to a transition at the input node 1202. The pulse includes a rising edge and a falling edge. The pulse width is sufficient to trigger the clocking input of the flip-flop 1234.

The pulse that is output from the XOR gate 1224 is provided to the other input of the AND gate 1228. The AND gate 1228 outputs the pulse to an input of the OR gate 1232. The OR gate 1232 forwards the pulse to an output thereof and applies the pulse to the clocking input of the flip-flop 1234. During the first operational steady-state condition 1300 of FIG. 13, a zero is present at the data output of the flip-flop 1234, and a one is present at the data input due to the inverter 1236. Responsive to the rising edge of the pulse triggering the clocking input of the flip-flop 1234, the one at the data input of the flip-flop 1234 is transferred to the data output. After a delay due to the configurable delay device 1238, the value at the output of the buffer 1240 and at the gate terminal of the first transistor 402 transitions from zero to one. The transition of the voltage at the gate terminal of the first transistor 402 from zero to one turns off the first transistor 402.

The one at the gate terminal of the first transistor 402 is provided to an input of the AND gate 1208. Until the voltage at the gate terminal of the first transistor 402 is switched to one, the AND gate 1208 in part prevents a change to an operational state of the second transistor 404 inasmuch as the clocking input of the flip-flop 1274 is not triggered. The delay control circuit 410 is effectively controlling an operational state of the second transistor 404 based on a voltage that controls an operational state of the first transistor 402. Additionally, the inverter 1266 provides a zero to an input of the AND gate 1268 to further prevent a pulse signal that is capable of triggering the clocking input of the flip-flop 1274 from propagating to the flip-flop 1274. Continuing with the AND gate 1208, because the voltage at the gate terminal of the second transistor 404 is still one at the time during transitional state 1400 at which the first transistor 402 switches from being on to being off, the AND gate 1208 outputs a one, which is represented by a rising edge of a signal. The signal becomes a pulse as illustrated after the second transistor 404 turns on to create a falling edge for the pulse, as is explained below. The rising edge that is output from the AND gate 1208 is provided to an input of the AND gate 1270. Due to the zero-to-one transition at the input node 1202, the AND gate 1270 has a one at the other input thereof. The rising edge is provided at the output of the AND gate 1270 and then to an input of the OR gate 1272.

The OR gate 1272 forwards the rising edge to an output thereof and applies the rising edge to the clocking input of the flip-flop 1274. During the first operational steady-state condition 1300 of FIG. 13, a zero is present at the data output of the flip-flop 1274, and a one is present at the data input due to the inverter 1276. The rising edge of the signal triggers the clocking input of the flip-flop 1274, so the one at the data input of the flip-flop 1274 is transferred to the data output of the flip-flop 1274. The value at the input of the configurable delay device 1278 thus transitions from zero to one. After a delay due to the configurable delay device 1278, the value at the output of the inverter 1280 and at the gate terminal of the second transistor 404 transitions from one to zero. The transition of the voltage at the gate terminal of the second transistor 404 from one to zero turns on the second transistor 404. The zero at the gate terminal of the second transistor 404 is provided to the other input of the AND gate 1208, which creates the falling edge of the illustrated pulse.

FIG. 15 illustrates an example second operational steady-state condition 1500 of the power-mux tile 110 of FIG. 12. The second operational steady-state condition 1500 reflects a condition after the transitional state 1400 of FIG. 14. The pulse has passed on the left side of the delay control circuit 410. The transition from one to zero at the gate terminal of the second transistor 404 has been propagated to and through the AND gate 1208 such that the AND gate 1270 and the OR gate 1272 have reached a steady-state condition. There is a zero at the output of the AND gate 1270 and at the output of the OR gate 1272.

With the second operational steady-state condition 1500, the input and the output of the configurable delay device 1238 are at one. The input of the configurable delay device 1278 is also at one, but the output of the configurable delay device 1278 is at zero. The input node 1202 is at one, and the output of the inverter 1226 is at one. Other nodes are at zero. The first transistor 402 is off, and the second transistor 404 is on. The delay control circuit 410 is ready for a transition to turn the first transistor 402 on and to turn the second transistor 404 off responsive to a change in the power rail selection signal 406.

FIG. 16 illustrates an example transitional state 1600 of the power-mux tile of FIG. 12. As part of the transitional state 1600, the first transistor 402 is transitioning from being off to being on, and the second transistor 404 is transitioning from being on to being off. The power rail selection signal 406 transitions from one to zero at the input node 1202. The inverter 1206 of the power rail selection decoder 1204 decodes the zero of the power rail selection signal 406 and produces a one on the left side of the delay control circuit 410. On the right side of the delay control circuit 410, the zero is provided to an input of the AND gate 1270 and inverted by the inverter 1266 to provide a one to an input of the AND gate 1268. The zero at the input node 1202 is provided to the left input of the XOR gate 1264. Because the propagation of this zero is delayed by buffers 1260 and 1262, the right input of the XOR gate 1264 temporarily remains at the one existing during the second operational steady-state condition 1500 of FIG. 15 and prior to the transition of FIG. 16. During the buffering delay produced by the buffers 1260 and 1262, the XOR gate 1264 produces a value of one temporarily. The temporary nature of the one value at the output of the XOR gate 1264 results in the creation of a pulse having a rising edge and a falling edge. Hence, the buffer 1260, the buffer 1262, and the XOR gate 1264 operate together as a pulse generator responsive to a transition of the power rail selection signal 406 at the input node 1202.

The pulse that is output from the XOR gate 1264 is provided to the other input of the AND gate 1268. The pulse propagates through the AND gate 1268 and through the OR gate 1272, and the rising edge of the pulse triggers the clocking input of the flip-flop 1274. The zero at the data input of the flip-flop 1274 is transferred to the data output to transition the input of the configurable delay device 1278 from one to zero. After a delay due to the configurable delay device 1278 and an inversion due to the inverter 1280 thereof, the value at the output of the inverter 1280 and at the gate terminal of the second transistor 404 transitions from zero to one. The transition of the voltage at the gate terminal of the second transistor 404 from zero to one turns off the second transistor 404.

The one at the gate terminal of the second transistor 404 is provided to an input of the AND gate 1208. Until the voltage at the gate terminal of the second transistor 404 is switched to a one, the AND gate 1208 in part prevents a change to an operational state of the first transistor 402 inasmuch as the clocking input of the flip-flop 1234 is not triggered. Additionally, the inverter 1226 provides a zero to an input of the AND gate 1228 to further prevent a signal pulse that is capable of triggering the clocking input of the flip-flop 1234 from reaching the flip-flop 1234. Continuing with the AND gate 1208, because the voltage at the gate terminal of the first transistor 402 is still one at the time of the transitional state 1600 at which the second transistor 404 switches from on to off, the output of the AND gate 1208 provides a one, which is represented by a rising edge of a signal, to an input of the AND gate 1230. The signal subsequently becomes a pulse with a falling edge as is explained below. Due to the one-to-zero transition at the input node 1202 and the inverter 1206 of the power rail selection decoder 1204, the AND gate 1230 has a one at the other input thereof. The rising edge from the output of the AND gate 1208 is therefore provided at the output of the AND gate 1230 and to an input of the OR gate 1232.

The OR gate 1232 forwards the rising edge of the signal to an output thereof and applies the rising edge to the clocking input of the flip-flop 1234. During the second operational steady-state condition 1500 of FIG. 15, a one is present at the data output of the flip-flop 1234, and a zero is present at the data input due to the inverter 1236. In response to the rising edge that triggers the clocking input of the flip-flop 1234, the zero at the data input of the flip-flop 1234 is transferred to the data output. The data output thus transitions from one to zero. After a delay due to the configurable delay device 1238, the value at the output of the buffer 1240 and at the gate terminal of the first transistor 402 transitions from one to zero. The transition of the voltage at the gate terminal of the first transistor 402 from one to zero turns on the first transistor 402. The zero at the gate terminal of the first transistor 402 is provided to the other input of the AND gate 1208, which creates the falling edge of the illustrated pulse by returning the output of the AND gate 1208 to zero. The power-mux tile 110 may thereafter settle into the first operational steady-state condition 1300 of the power-mux tile 110 as shown in FIG. 13.

Figure 17:
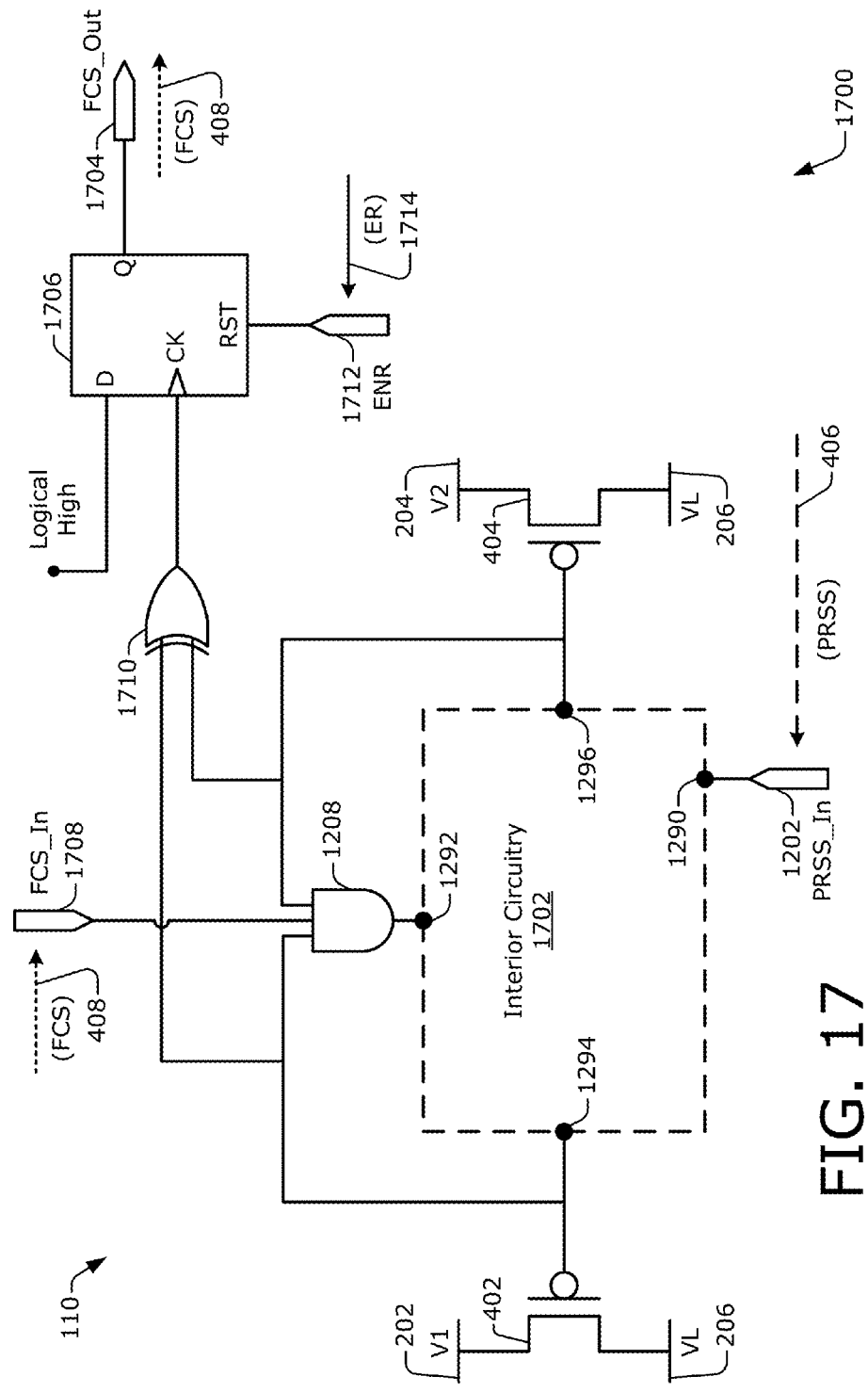
FIG. 17 depicts an example generation of a feedback control signal that is output from a power-mux tile as shown in FIG. 12.

FIG. 17 depicts at 1700 generally an example generation of a feedback control signal 408 (of FIGS. 4-10) that is output from a power-mux tile 110, which is shown in greater detail in FIGS. 12-16. At least a portion of the power-mux circuitry 210 of FIG. 2 that is internal to the power-mux tile 110 is represented in FIG. 17 by interior circuitry 1702. The power-mux tile 110 is partially depicted with reference to FIG. 12 by identifying the node 1290, the node 1292, the node 1294, and the node 1296. Circuit devices that are within these four nodes as shown in FIG. 12 are omitted from FIG. 17 to avoid obscuring other described aspects, but the circuit devices between nodes 1290, 1292, 1294, and 1296 are represented by the interior circuitry 1702, which may include at least a portion of the delay control circuitry 410 of FIG. 4. FIG. 17 also includes the first transistor 402 and the second transistor 404 of FIGS. 4 and 12-16 and the AND gate 1208 of FIGS. 12-16. FIG. 17 further includes an XOR gate 1710 and a flip-flop 1706.

In one or more embodiments, the power-mux tile 110 includes the flip-flop 1706 that is implemented to generate the feedback control signal 408 that is provided to the multiplexer 604 of FIG. 6. The flip-flop 1706 may comprise, for example, a D-type flip-flop having a clocking or triggering input, a data input "D", a data output "Q," and a reset input "RST." The data input of the flip-flop 1706 receives a signal that is tied to a logical high, such as a supply voltage. The data output produces the feedback control signal 408 at a feedback control signal output node 1704 (FCS_Out) that is fed to the multiplexer 604 of FIG. 6 toward a succeeding power-mux tile in a chained series of multiple power-mux tiles. The reset input is coupled to an enable rest signal input node 1712 (ENR) that receives an enable rest signal 1714 (ER), as described below. The clocking input is coupled to an output of the XOR gate 1710.

The input node 1202 is labeled as the power rail selection signal input node 1202 (PRSS_In) to further link the input/output indications of FIG. 6 with the input node of FIGS. 12-16. The power rail selection signal input node 1202 receives the power rail selection signal 406. A feedback control signal input node 1708 (FCS_In) receives the feedback control signal 408 from a preceding power-mux tile in the chained series of multiple power-mux tiles. The feedback control signal input node 1708 is coupled to a third input of the AND gate 1208. As described above with reference to FIG. 12, two other inputs of the AND gate 1208 are coupled to the node 1294 and the node 1296. The XOR gate 1710 has one input coupled to the node 1294 and another input coupled to the node 1296. An output of the XOR gate 1710 is coupled to the clocking input of the flip-flop 1706. The flip-flop 1706 and the XOR gate 1710 may be considered part of the adjustment circuitry 208 of FIG. 2 or additional circuit devices of the power-mux circuitry 210 generally.

In an example operation, the power rail selection signal 406 is received at the power rail selection signal input node 1202 to initiate the disconnection portion 308 of the power-multiplexing operation 300 of FIG. 3. For example, as described above with reference to FIGS. 13 and 14, the first transistor 402 may be turned off responsive to the power rail selection signal 406. The connection portion 310 may proceed if the first transistor 402 is turned off and if the incoming feedback control signal 408 at the feedback control signal input node 1708 is asserted. The incoming feedback control signal 408 is in an asserted state if the preceding power-mux tile (not shown in FIG. 17) has completed the connection portion 310 or if the adjustment circuitry 208 (not explicitly shown) has selected the illustrated power-mux tile 110 for out-of-order power rail connection. If the input feedback control signal 408 is asserted at the feedback control signal input node 1708, the second transistor 404 may be turned on as described above with reference to FIGS. 13 and 14.

Example functionality is now described with the illustrated power-mux tile 110 representing a "current" power-mux tile 110. A succeeding power-mux tile (not shown in FIG. 17) is enabled to perform the connection portion 310, even if a value of an associated feedback adjustment signal is a logical low, if the output feedback control signal 408 is at a logical high value at the feedback control signal output node 1704 because the illustrated power-mux tile 110 has performed the connection portion 310 of the power-multiplexing operation.

Reference is now made to FIGS. 13-15 for the logical values that are illustrated at the node 1294 and the node 1296. As noted above, the locations of the node 1294 and the node 1296 are explicitly depicted in FIG. 12 as being at the gate of the first transistor 402 and at the gate of the second transistor 404, respectively. With reference to FIG. 13 for the first operational steady-state condition 1300, the two inputs to the XOR gate 1710 are zero and one at the node 1294 and the node 1296, respectively. Hence, the output of the XOR gate 1710 is logical high during the first operational steady-state condition 1300. During the transitional state 1400 of FIG. 14, the node 1294 and the node 1296 are at least momentarily of the same value, namely one, which causes the XOR gate 1710 to output a low value. Once the second operational steady-state condition 1500 of FIG. 15 is reached, the second transistor 404 is turned on and the values at the node 1294 and the node 1296 are again different, namely one and zero respectively.

Thus, after the connection portion 310 is complete at the illustrated power-mux tile 110, the inputs of the XOR gate 1710 have different values of one and zero. Responsive to the different values of the second operational steady-state condition 1500, the XOR gate 1710 outputs a high value at the clocking input of the flip-flop 1706. The low and then high output values of the XOR gate 1710 for the transitional state 1400 and then for the second operational steady-state condition 1500 effectively produce a rising edge that triggers the clocking input of the flip-flop 1706. The triggered clocking input causes the logical high value at the data input of the flip-flop 1706 to be advanced to the data output. The data output therefore produces a logical high value on the feedback control signal output node 1704 that is forwarded to the multiplexer 604 as the output feedback control signal 408.

In some implementations, power-mux tiles 110, or the transistors thereof, of an integrated circuit portion are divided into the "few" and the "rest." The few transistors are turned on in an orderly fashion to handle potential voltage droops and current losses. The rest of the transistors are then turned on. The power-mux tile 110 of the chained series of power-mux tiles described herein may be implemented as one of the "few." When the rest are enabled, the enable rest signal 1714 is asserted. The enable rest signal 1714 is fed to the reset input of the flip-flop 1706 via the enable rest signal input node 1712. Assertion of the enable rest signal 1714 therefore causes the data output of the flip-flop 1706 to be reset to a logical low value.

Figure 18:
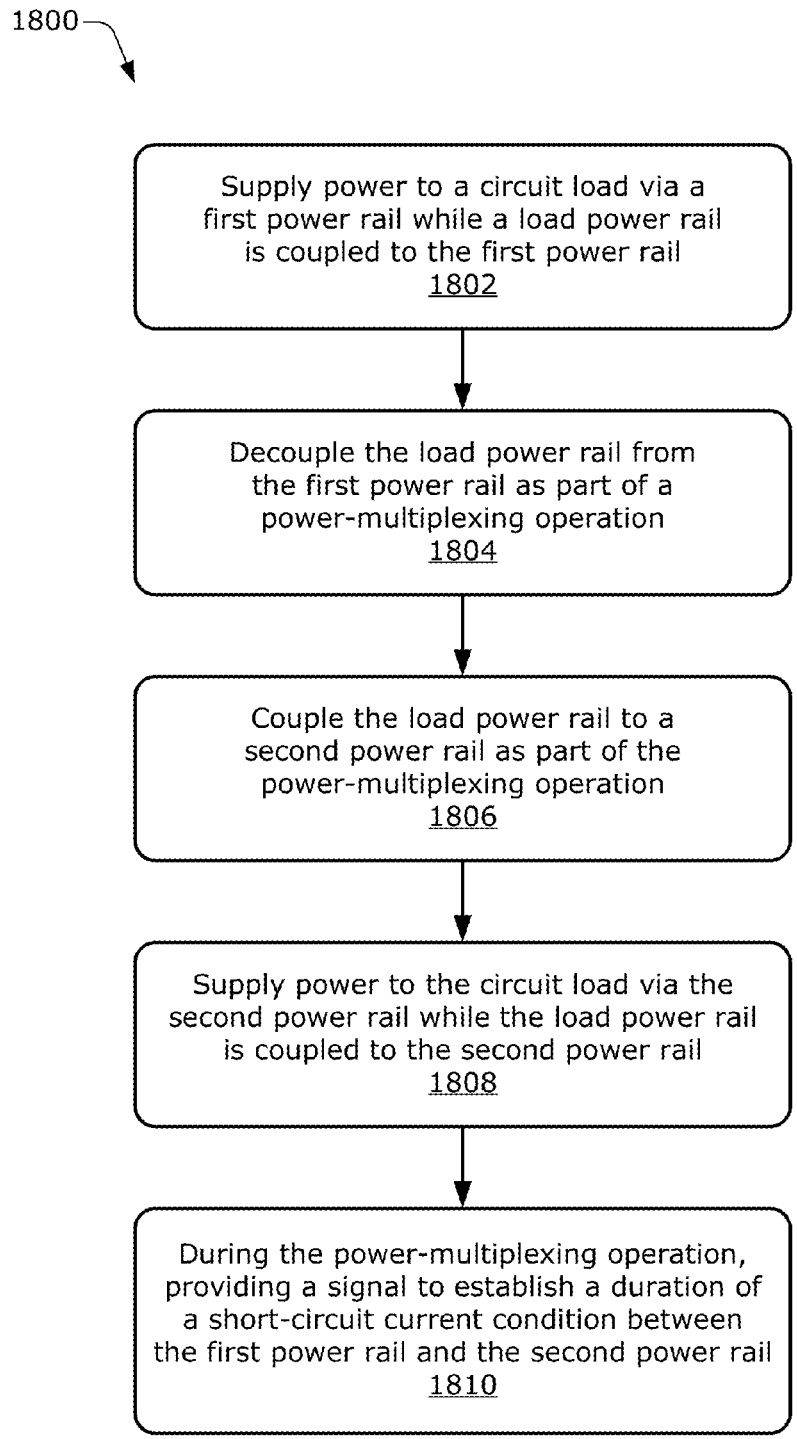
FIG. 18 is a flow diagram illustrating an example process for adjustable power rail multiplexing.

FIG. 18 is a flow diagram illustrating an example process 1800 for adjustable power rail multiplexing. Process 1800 is described in the form of a set of blocks 1802-1810 that specify operations that may be performed. However, operations are not necessarily limited to the order shown in FIG. 18 or described herein, for the operations may be implemented in alternative orders or in fully or partially overlapping manners. Operations represented by the illustrated blocks of process 1800 may be performed by an integrated circuit, such as an integrated circuit 1910 of FIG. 19, which is described below. For example, the operations of process 1800 may be performed by multiple power-mux tiles along with multiple power rails in conjunction with power-mux circuitry. The operations may be performed, for instance, by the multiple power-mux tiles 110-1 to 110-10 along with the power-mux circuitry 210 and in conjunction with the first power rail 102, the second power rail 104, and the load power rail 106 of FIGS. 1 and 2.

At block 1802, power is supplied to a circuit load via a first power rail while a load power rail is coupled to the first power rail. For example, circuitry of an integrated circuit 1910 may supply power to a circuit load 108 via a first power rail 102 while a load power rail 106 is coupled to the first power rail 102. To do so, current may be permitted to flow from the first power rail 102 through multiple first switches 212 that are in a closed state to the load power rail 106, which is coupled to the circuit load 108.

At block 1804, the load power rail is decoupled from the first power rail as part of a power-multiplexing operation. For example, circuitry of the integrated circuit 1910 may decouple the load power rail 106 from the first power rail 102 as part of a power-multiplexing operation 300. A disconnection portion 308 of the power-multiplexing operation 300 may be at least partially effectuated by, for instance, opening the multiple first switches 212. In an example implementation, the multiple first switches 212 are coupled between the first power rail 102 and the load power rail 106 and are part of multiple power-mux tiles 110-1 to 110-10.

At block 1806, the load power rail is coupled to a second power rail as part of the power-multiplexing operation. For example, circuitry of the integrated circuit 1910 may couple the load power rail 106 to a second power rail 104 as part of the power-multiplexing operation 300. A connection portion 310 of the power-multiplexing operation 300 may be at least partially effectuated by, for instance, closing multiple second switches 214. In an example implementation, the multiple second switches 214 are coupled between the second power rail 104 and the load power rail 106 and are part of multiple power-mux tiles 110-1 to 110-10.

At block 1808, power is supplied to the circuit load via the second power rail while the load power rail is coupled to the second power rail. For example, circuitry of the integrated circuit 1910 may supply power to the circuit load 108 via the second power rail 104 while the load power rail 106 is coupled to the second power rail 104. To do so, current may be permitted to flow from the second power rail 104 through multiple second switches 214 that are in a closed state to the load power rail 106, which is coupled to the circuit load 108.

At block 1810, during the power-multiplexing operation, a duration of a short-circuit current condition between the first power rail and the second power rail is established by providing a signal. For example, during the power-multiplexing operation 300, circuitry of the integrated circuit 1910 may provide a signal (e.g., a feedback control signal 408, a preset signal 502, a feedback adjustment signal 504, or a combination thereof) to establish a duration 312 of a short-circuit current condition between the first power rail 102 and the second power rail 104. For instance, adjustment circuitry 208 may generate a feedback adjustment signal 504 that causes at least one second switch 214 to close while at least one first switch 212 is still closed.

In an example implementation, the decoupling of block 1804 includes propagating a power rail selection signal through multiple power-mux tiles coupled in a series in a chained arrangement to a last power-mux tile of the series. For example, circuitry of the integrated circuit 1910 may propagate a power rail selection signal 406 through multiple power-mux tiles 110-1 to 110-10 that are coupled in series in a chained arrangement and that terminate at a last power-mux tile 110-10 of the chained arrangement.

In another example implementation, the coupling of block 1806 includes propagating a feedback control signal through a chained arrangement of multiple power-mux tiles coupled in a series starting from a last power-mux tile of the chained arrangement. For example, circuitry of the integrated circuit 1910 may propagate a feedback control signal 408 through multiple power-mux tiles 110-1 to 110-10 that are coupled in series in a chained arrangement and by starting the propagation from a last power-mux tile 110-10 of the chained arrangement.

In another example implementation, the providing of the signal of block 1810 may include providing a feedback adjustment signal to a particular power-mux tile of the multiple power-mux tiles to advance an occurrence of the coupling of the load power rail to the second power rail at the particular power-mux tile. For example, circuitry of the integrated circuit 1910 may provide a feedback adjustment signal 504 to a particular power-mux tile 110 of the multiple power-mux tiles 110-1 to 110-10 to advance in time an occurrence of the coupling of the load power rail 106 to the second power rail 104 at the particular power-mux tile 110. Furthermore, the providing of the feedback adjustment signal may include selecting as an input feedback control signal for the particular power-mux tile a preset signal set to a logical high value instead of an output feedback control signal produced by another power-mux tile that is consecutive with the particular power-mux tile and precedes the particular power-mux tile in a feedback direction along the series in which the multiple power-mux tiles are coupled for the chained arrangement. For example, circuitry of the integrated circuit 1910 may select as an input feedback control signal 408, for a feedback control signal input node 1708, for the particular power-mux tile 110 (i) a preset signal 502 set to a logical high value or (ii) an output feedback control signal 408, obtained from a feedback control signal output node 1704, that is produced by another power-mux tile. The other power-mux tile is consecutive with the particular power-mux tile 110 and precedes the particular power-mux tile 110 in a feedback direction along the series of the multiple power-mux tiles 110-1 to 110-10. The feedback direction corresponds to a direction of propagation of the feedback control signal 408, which is indicated by the arrows 704 of FIGS. 7-10.

In another example implementation, the providing of the signal of block 1810 may include providing a preset signal set to a logical high value to cause a feedback control signal input of a particular power-mux tile of the multiple power-mux tiles to have a logical high value so as to advance an occurrence of the coupling of the load power rail to the second power rail at the particular power-mux tile. For example, circuitry of the integrated circuit 1910 may provide a preset signal 502 set to a logical high value to cause a feedback control signal input of a particular power-mux tile 110 of the multiple power-mux tiles 110-1 to 110-10 to have a logical high value so as to advance an occurrence of the coupling of the load power rail 106 to the second power rail 104 at the particular power-mux tile 110.

In another example implementation, the supplying power to the circuit load via the first power rail of block 1802 and the supplying power to the circuit load via the second power rail of block 1808 may include simultaneously supplying power to the circuit load via the first power rail at one power-mux tile and supplying power to the circuit load via the second power rail at another power-mux tile. For example, circuitry of the integrated circuit 1910 may simultaneously supply power to the circuit load 108 via the first power rail 102 at one power-mux tile 110 (e.g., power-mux tile 110-10) and supply power to the circuit load 108 via the second power rail 104 at another power-mux tile 110 (e.g., the power-mux tile 110-7).

Figure 19:
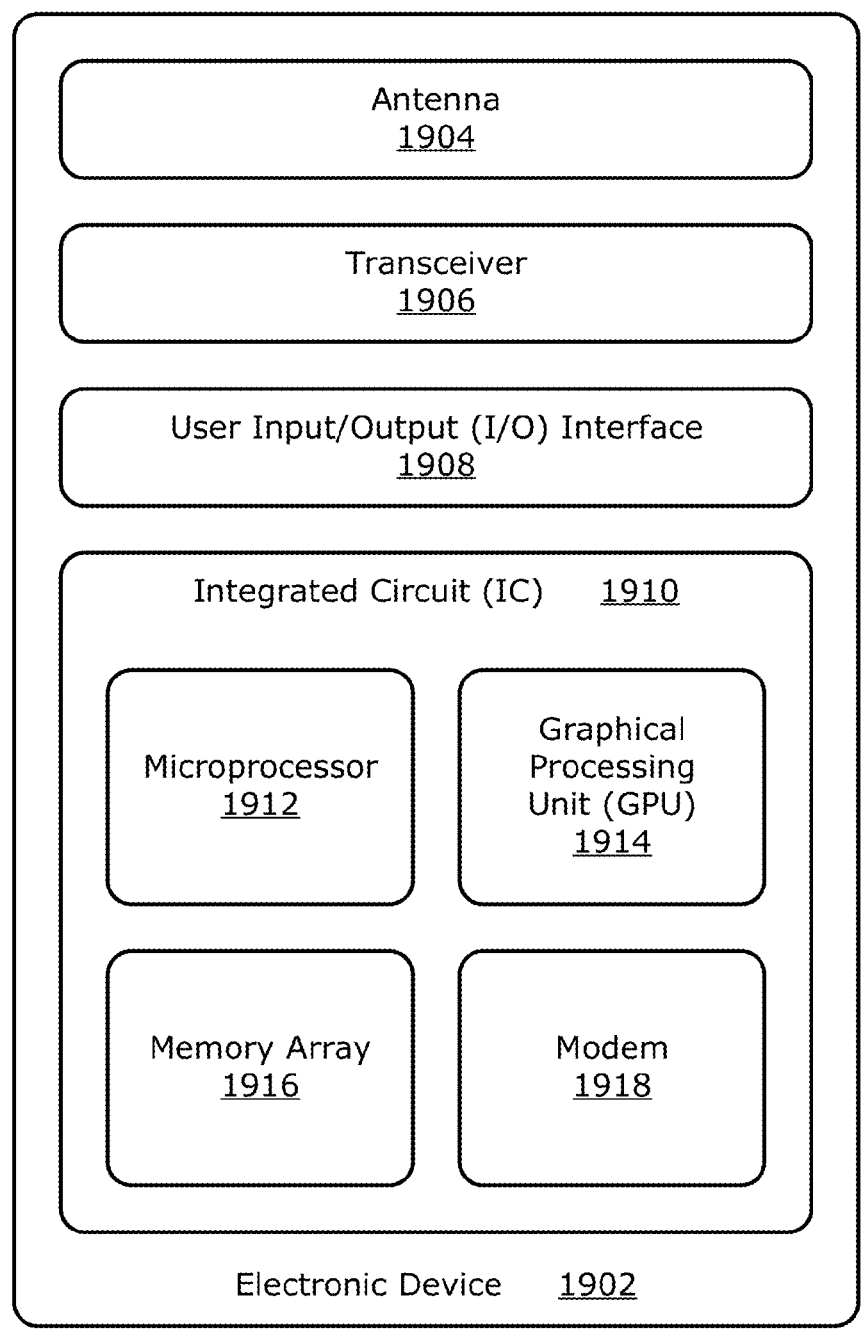
FIG. 19 depicts an example electronic device that includes an integrated circuit (IC).

FIG. 19 depicts an example electronic device 1902 that includes an integrated circuit (IC) 1910. As shown, the electronic device 1902 includes an antenna 1904, a transceiver 1906, and a user input/output (I/O) interface 1908 in addition to the IC 1910. Illustrated examples of an IC 1910 include a microprocessor 1912, a graphics processing unit (GPU) 1914, a memory array 1916, and a modem 1918.

The electronic device 1902 may be a mobile or battery-powered device or a fixed device that is designed to be powered by an electrical grid. Examples of an electronic device 1902 include a server computer, a network switch or router, a blade of a data center, a personal computer, a desktop computer, a notebook computer, a tablet computer, a smart phone, an entertainment appliance, or a wearable computing device such as a smartwatch, intelligent glasses, or an article of clothing. An electronic device 1902 may also be a device, or a portion thereof, having embedded electronics. Examples of an electronic device 1902 with embedded electronics include a passenger vehicle, industrial equipment, a refrigerator or other home appliance, a drone or other unmanned aerial vehicle (UAV), or a power tool.

For an electronic device with a wireless capability, the electronic device 1902 includes an antenna 1904 that is coupled to a transceiver 1906 to enable reception or transmission of one or more wireless signals. The IC 1910 may be coupled to the transceiver 1906 to enable the IC 1910 to have access to received wireless signals or to provide wireless signals for transmission via the antenna 1904. The electronic device 1902 as shown also includes at least one user I/O interface 1908. Examples of an I/O interface 1908 include a keyboard, a mouse, a microphone, a touch-sensitive screen, a camera, an accelerometer, a haptic mechanism, a speaker, a display screen, or a projector.

The IC 1910 may comprise, for example, one or more instances of a microprocessor 1912, a GPU 1914, a memory array 1916, a modem 1918, and so forth. The microprocessor 1912 may function as a central processing unit (CPU) or other general-purpose processor. Some microprocessors include different parts, such as multiple processing cores, that may be individually powered on or off. The GPU 1914 may be especially adapted to process visual-related data for display. If visual-related data is not being rendered or otherwise processed, the GPU 1914 may be powered down. The memory array 1916 stores data for the microprocessor 1912 or the GPU 1914. Example types of memory for the memory array 1916 include random access memory (RAM), such as dynamic RAM (DRAM) or static RAM (SRAM), flash memory, and so forth. If programs are not accessing data stored in memory, the memory array 1916 may be powered down. The modem 1918 modulates a signal to encode information into the signal or demodulates a signal to extract encoded information. If there is no information to encode or decode for outbound or inbound communication, the modem 1918 may be idled to reduce power consumption. The IC 1910 may include additional or alternative parts than those that are shown, such as an I/O interface, a sensor such as an accelerometer, a transceiver or another part of a receiver chain, a customized or hard-coded processor such as an application-specific integrated circuit (ASIC), and so forth.

The IC 1910 may also comprise a system on a chip (SOC). An SOC may integrate a sufficient number or type of components to enable the SOC to provide computational functionality as a notebook, a mobile phone, or another electronic apparatus using one chip at least primarily. Components of an SOC, or an IC 1910 generally, may be termed blocks or cores. Examples of cores or circuitry blocks include a voltage regulator, a memory array, a memory controller, a general-purpose processor, a cryptographic processor, a modem, a vector processor, an interface or communication controller, a wireless controller, or a GPU. Any of these cores or circuitry blocks, such as a processing or GPU core, may further include multiple internal cores. A core of an SOC may be powered down if not in use according to the techniques described in this document.

Unless context dictates otherwise, use herein of the word "or" may be considered use of an "inclusive or," or a term that permits inclusion or application of one or more items that are linked by the word "or" (e.g., a phrase "A or B" may be interpreted as permitting just "A," as permitting just "B," or as permitting both "A" and "B"). Although subject matter has been described in language specific to structural features or methodological operations, it is to be understood that the subject matter defined in the appended claims is not necessarily limited to the specific features or operations described above, including not necessarily being limited to the organizations in which features are arranged or the orders in which operations are performed.

What is claimed is:

1. An integrated circuit comprising:
    a first power rail;
    a second power rail;
    a load power rail;
    multiple power-multiplexer tiles coupled in series in a chained arrangement and configured to jointly perform a power-multiplexing operation, each power-multiplexer tile configured to switch between coupling the load power rail to the first power rail and coupling the load power rail to the second power rail; and
    adjustment circuitry configured to adjust at least one order in which the multiple power-multiplexer tiles perform at least a portion of the power-multiplexing operation.

2. The integrated circuit of claim 1, wherein:
    the power-multiplexing operation is effectuated across the chained arrangement of the multiple power-multiplexer tiles;
    the power-multiplexing operation includes a disconnection portion and a connection portion;
    the multiple power-multiplexer tiles are configured to perform the disconnection portion of the power-multiplexing operation in a sequential order; and
    the adjustment circuitry is further configured to cause the multiple power-multiplexer tiles to perform the connection portion of the power-multiplexing operation in a non-sequential order.

3. The integrated circuit of claim 2, wherein the adjustment circuitry is further configured to enable at least one power-multiplexer tile of the multiple power-multiplexer tiles to perform the connection portion of the power-multiplexing operation out of an order that is determined by a series coupling of the chained arrangement of the multiple power-multiplexer tiles.

4. The integrated circuit of claim 3, wherein the adjustment circuitry is further configured to provide to the at least one power-multiplexer tile an input feedback control signal selected from a preset signal set to a logical high value or an output feedback control signal produced by a preceding power-multiplexer tile.

5. The integrated circuit of claim 4, wherein:
    the at least one power-multiplexer tile is configured to connect the load power rail to the second power rail responsive to the input feedback control signal having the logical high value; and
    the adjustment circuitry is further configured to select the preset signal as the input feedback control signal for the at least one power-multiplexer tile to enable the at least one power-multiplexer tile to couple the load power rail to the second power rail out of the order that is determined by the series coupling of the chained arrangement of the multiple power-multiplexer tiles.

6. The integrated circuit of claim 3, wherein the adjustment circuitry is further configured to provide to the at least one power-multiplexer tile an input feedback control signal that is set to a logical high value to enable the at least one power-multiplexer tile to couple the load power rail to the second power rail out of the order that is determined by the series coupling of the chained arrangement of the multiple power-multiplexer tiles.

7. The integrated circuit of claim 6, wherein the adjustment circuitry is further configured to provide a feedback adjustment signal that is tied to a preset value to cause the input feedback control signal to be coupled to a preset signal set to a logical high value.

8. The integrated circuit of claim 1, wherein:
    the multiple power-multiplexer tiles are further configured to switch between coupling the load power rail to the first power rail and coupling the load power rail to the second power rail in at least one sequential order to avoid creation of a short-circuit current condition between the first power rail and the second power rail in one mode; and
    the adjustment circuitry is further configured to enable adjustment of a duration for which the load power rail is coupled to both the first power rail and the second power rail in another mode by enabling one or more power-multiplexer tiles of the multiple power-multiplexer tiles to selectively couple the load power rail to the second power rail out of the at least one sequential order.

9. The integrated circuit of claim 8, wherein a length of the duration is controllable based on a number of intervening power-multiplexer tiles between one power-multiplexing tile that is last in the chained arrangement of the multiple power-multiplexer tiles and another power-multiplexer tile that is first to be enabled to couple the load power rail to the second power rail out of the at least one sequential order.

10. The integrated circuit of claim 1, wherein each power-multiplexer tile of the multiple power-multiplexer tiles includes:
    a first switch configured to connect or disconnect the load power rail to or from the first power rail;
    a second switch configured to connect or disconnect the load power rail to or from the second power rail; and
    a delay control circuit configured to prevent the first switch and the second switch of a given power-multiplexer tile from being closed simultaneously.

11. The integrated circuit of claim 10, wherein the delay control circuit comprises self-timed circuitry that is independent of a periodic clock signal.

12. The integrated circuit of claim 1, wherein the adjustment circuitry is further configured to cause a temporal overlap region in which one power-multiplexer tile of the multiple power-multiplexer tiles is coupling the load power rail to the first power rail and another power-multiplexer tile of the multiple power-multiplexer tiles is coupling the load power rail to the second power rail.

13. The integrated circuit of claim 1, wherein:
    the multiple power-multiplexer tiles comprise multiple first power-multiplexer tiles that form a first chained series of power-multiplexer tiles;
    the integrated circuit further comprises a second chained series of power-multiplexer tiles including multiple second power-multiplexer tiles coupled in series in a chained arrangement and configured to jointly perform the power-multiplexing operation; and
    the adjustment circuitry is further configured to establish a duration of a short-circuit current condition created between the first power rail and the second power rail by coordinating operation of the first chained series of power-multiplexer tiles and the second chained series of power-multiplexer tiles.

14. An integrated circuit comprising:
a first power rail;
a second power rail;
a load power rail;
multiple power-multiplexer tiles coupled in series in a chained arrangement and configured to perform a power-multiplexing operation including switching between coupling the load power rail to the first power rail and coupling the load power rail to the second power rail, the power-multiplexing operation having at least one order that is determined by the series in which the multiple power-multiplexer tiles are coupled for the chained arrangement; and
adjustment means for adjusting the at least one order in which the multiple power-multiplexer tiles are to perform at least a portion of the power-multiplexing operation.

15. The integrated circuit of claim 14, wherein the adjustment means comprises means for establishing a duration that a short-circuit current condition exists between the first power rail and the second power rail across different power-multiplexer tiles during the power-multiplexing operation.

16. The integrated circuit of claim 14, wherein the adjustment means comprises means for enabling a particular power-multiplexer tile of the multiple power-multiplexer tiles to perform at least part of the power-multiplexing operation out of the at least one order.

17. The integrated circuit of claim 14, wherein the integrated circuit further comprises means for controlling a decoupling of the load power rail from the first power rail in a sequential order along the series in which the multiple power-multiplexer tiles are coupled for the chained arrangement.

18. The integrated circuit of claim 14, wherein the adjustment means comprises means for controlling a coupling of the load power rail to the second power rail in a selectable order.

19. The integrated circuit of claim 18, wherein the means for controlling the coupling comprises means for selecting a particular power-multiplexer tile of the multiple power-multiplexer tiles for switching out of a sequential order.

20. The integrated circuit of claim 19, wherein the means for selecting the particular power-multiplexer tile comprises means for forwarding a preset signal set to a logical high value, instead of an output feedback control signal produced by a preceding power-multiplexer tile, to the particular power-multiplexer tile to select the particular power-multiplexer tile.

21. A method for adjustable power rail multiplexing in an integrated circuit, the method comprising:
supplying power to a circuit load via a first power rail while a load power rail is coupled to the first power rail;
decoupling the load power rail from the first power rail as part of a power-multiplexing operation;
coupling the load power rail to a second power rail as part of the power-multiplexing operation;
supplying power to the circuit load via the second power rail while the load power rail is coupled to the second power rail; and
during the power-multiplexing operation, providing a signal to establish a duration of a short-circuit current condition between the first power rail and the second power rail.

22. The method of claim 21, wherein:
the decoupling comprises opening multiple first switches of multiple power-multiplexer tiles, the multiple first switches of multiple power-multiplexer tiles coupled between the first power rail and the load power rail; and
the coupling comprises closing multiple second switches of the multiple power-multiplexer tiles, the multiple second switches coupled between the second power rail and the load power rail.

23. The method of claim 21, wherein:
the decoupling comprises propagating a power rail selection signal through multiple power-multiplexer tiles coupled in series in a chained arrangement to a last power-multiplexer tile of the chained arrangement; and
the coupling comprises propagating a feedback control signal through the chained arrangement of the multiple power-multiplexer tiles starting from the last power-multiplexer tile of the chained arrangement.

24. The method of claim 21, wherein the providing the signal comprises providing a feedback adjustment signal to a particular power-multiplexer tile of multiple power-multiplexer tiles to advance an occurrence of the coupling of the load power rail to the second power rail at the particular power-multiplexer tile.

25. The method of claim 24, wherein the providing the feedback adjustment signal comprises selecting as an input feedback control signal for the particular power-multiplexer tile a preset signal set to a logical high value instead of an output feedback control signal produced by another power-multiplexer tile that is consecutive with the particular power-multiplexer tile and precedes the particular power-multiplexer tile in a feedback direction along a series in which the multiple power-multiplexer tiles are coupled in a chained arrangement.

26. The method of claim 21, wherein the providing the signal comprises providing a preset signal set to a logical high value to cause a feedback control signal input of a particular power-multiplexer tile of multiple power-multiplexer tiles to have a logical high value so as to advance an occurrence of the coupling of the load power rail to the second power rail at the particular power-multiplexer tile.

27. The method of claim 21, wherein the supplying power to the circuit load via the first power rail and the supplying power to the circuit load via the second power rail comprise simultaneously supplying power to the circuit load via the first power rail at one power-multiplexer tile and supplying power to the circuit load via the second power rail at another power-multiplexer tile.

28. An apparatus comprising:
a circuit load;
a first power rail;
a second power rail;
a load power rail that is coupled to the circuit load;
multiple power-multiplexer tiles disposed in a chained arrangement and configured to propagate a power rail selection signal between consecutive power-multiplexer tiles in a first direction along the chained arrangement to disconnect the first power rail from the load power rail and to propagate a feedback control signal between consecutive power-multiplexer tiles in a second direction along the chained arrangement to connect the second power rail to the load power rail; and
adjustment circuitry configured to enable establishment of a timing of an occurrence of a connection of the second power rail to the load power rail at a particular power-multiplexer tile of the multiple power-multiplexer tiles.

29. The apparatus of claim 28, wherein:
the second direction is a reverse of the first direction along the chained arrangement;
the multiple power-multiplexer tiles include a last power-multiplexer tile along the chained arrangement; and
the adjustment circuitry is further configured to advance the timing of the occurrence of the connection of the second power rail to the load power rail at the particular power-multiplexer tile so as to transpire prior to an occurrence of a connection of the second power rail to the load power rail at the last power-multiplexer tile.

30. The apparatus of claim 28, wherein:
the second direction is a reverse of the first direction along the chained arrangement;
the multiple power-multiplexer tiles include a last power-multiplexer tile in the first direction at a terminating end of the chained arrangement; and
the adjustment circuitry is further configured to advance the timing of the occurrence of the connection of the second power rail to the load power rail at the particular power-multiplexer tile so as to transpire prior to an occurrence of a disconnection of the first power rail from the load power rail at the last power-multiplexer tile.

* * * * *